US012610653B2

(12) United States Patent
Hu et al.

(10) Patent No.: US 12,610,653 B2
(45) Date of Patent: Apr. 21, 2026

(54) SOLAR CELL, PREPARATION METHOD THEREOF AND PHOTOVOLTAIC MODULE

(71) Applicant: TRINA SOLAR CO., LTD., Changzhou (CN)

(72) Inventors: Yunyun Hu, Changzhou (CN); Wei Liu, Changzhou (CN); Daming Chen, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/757,722

(22) Filed: Jun. 28, 2024

(65) Prior Publication Data

US 2024/0355941 A1      Oct. 24, 2024

(30) Foreign Application Priority Data

Dec. 19, 2023     (CN) .......................... 202311748107.X

(51) Int. Cl.
*H10F 77/30*          (2025.01)
*H10F 77/164*          (2025.01)
              (Continued)

(52) U.S. Cl.
CPC ....... *H10F 77/315* (2025.01); *H10F 77/1645* (2025.01); *H10F 77/1662* (2025.01);
              (Continued)

(58) Field of Classification Search
CPC .............. H10F 77/315; H10F 77/1645; H10F 77/1662; H10F 77/215; H10F 77/219;
              (Continued)

(56) References Cited

U.S. PATENT DOCUMENTS 4,253,881 A * 3/1981 Hezel ...................... H10F 10/12
                                                                136/255
2003/0168096 A1* 9/2003 Ouchida ............... H10F 77/247
                                                                438/98
(Continued)

FOREIGN PATENT DOCUMENTS

CN          109524480 A        3/2019
CN          109841693 A        6/2019
          (Continued)

OTHER PUBLICATIONS

English machine translation of WO 2020/238199 A1 (Year: 2020).*
(Continued)

*Primary Examiner* — Angelo Trivisonno
(74) *Attorney, Agent, or Firm* — MARSHALL, GERSTEIN & BORUN LLP

(57)          ABSTRACT

A solar cell, a preparation method thereof, and a photovoltaic module. The solar cell includes a semiconductor substrate, a first substrate doped layer, a second substrate doped layer, a first passivation layer, and a first doped semiconductor layer. The semiconductor substrate includes a first surface, and the first surface includes a first region and a second region adjacent to the first region along a first direction. The first substrate doped layer is located in the first region. The second substrate doped layer is located in the second region, and the first substrate doped layer is connected to the second substrate doped layer. The first passivation layer is located on a side of the second substrate doped layer away from the semiconductor substrate. The first doped semiconductor layer is located on a side of the first passivation layer away from the semiconductor substrate.

20 Claims, 4 Drawing Sheets

(51) Int. Cl.

| | |
|---|---|
| *H10F 77/166* | (2025.01) |
| *H10F 77/20* | (2025.01) |
| *H10F 77/70* | (2025.01) |

(52) U.S. Cl.
CPC .......... *H10F 77/215* (2025.01); *H10F 77/219* (2025.01); *H10F 77/707* (2025.01)

(58) Field of Classification Search
CPC ...... H10F 77/707; H10F 10/14; H10F 10/166; H10F 71/00; H10F 71/103; H10F 77/14; H10F 77/20; H10F 77/703; H10F 77/311
See application file for complete search history.

(56) References Cited

U.S. PATENT DOCUMENTS

| | | | | |
|---|---|---|---|---|
| 2011/0048531 A1* | 3/2011 | Lee | ........................ | H10F 77/311 257/E31.124 |
| 2014/0096820 A1* | 4/2014 | Neumayer | ............ | H10F 77/211 136/258 |
| 2022/0302334 A1 | 9/2022 | Yang et al. | | |

FOREIGN PATENT DOCUMENTS

| | | | |
|---|---|---|---|
| CN | 110890432 | A | 3/2020 |
| CN | 111063760 | A | 4/2020 |
| CN | 112310233 | A | 2/2021 |
| CN | 112542519 | A | 3/2021 |
| CN | 113948590 | A | 1/2022 |
| CN | 114613865 | A | 6/2022 |
| CN | 115513306 | A | 12/2022 |
| CN | 115513339 | A | 12/2022 |
| CN | 115621333 | B | 3/2023 |
| CN | 115939240 | A | 4/2023 |
| CN | 116525708 | B | 9/2023 |
| CN | 116936679 | A | 10/2023 |
| CN | 117038746 | A | 11/2023 |
| CN | 220121855 | U | 12/2023 |
| WO | WO-2020238199 A1 * | 12/2020 | ........... H10F 71/121 |

OTHER PUBLICATIONS

European Search Report, European Patent Application No. 24221087.2, dated Dec. 2, 2024.

Notice of Acceptance, Australian Patent Application No. 2024204737, dated Dec. 4, 2024.

European Search Report, European Patent Application No. 24221087.0, dated May 12, 2025.

Notice of Acceptance, Australian Application No. 2024278570, dated Dec. 16, 2025.

* cited by examiner

SOLAR CELL, PREPARATION METHOD THEREOF AND PHOTOVOLTAIC MODULE

CROSS-REFERENCE TO RELATED APPLICATION

This application claims priority to Chinese patent application No. 202311748107.X, filed on Dec. 19, 2023, and titled "SOLAR CELL, PREPARATION METHOD THEREOF AND PHOTOVOLTAIC MODULE", the content of which is hereby incorporated herein in its entirety by reference.

TECHNICAL FIELD

The present application relates to the field of photovoltaic technology, and specifically to solar cells, preparation methods thereof, and photovoltaic modules.

BACKGROUND

As the currently dominant solar cells in the market, passivated emitter and rear cells (PERCs) have nearly reached their maximum theoretical photovoltaic conversion efficiency in mass production. However, the pursuit for even higher efficiency will never end, prompting the industry to actively seek out the next generation of high-efficiency technologies. Currently, the leading technologies in development include tunnel oxide passivated contact (TOPCon), interdigitated back contact (IBC), and heterojunction (HJT), among which HJT is considered as a promising direction for the third revolution in the photovoltaic industry due to its exceptional conversion efficiency, streamlined manufacturing processes, and compatibility with thin silicon wafers. With a growing number of companies entering the HJT solar cell field, it is anticipated that HJT technology will stand out among various solar cell technologies in the future, and large-scale mass production of HJT solar cells will be eventually realized.

While HJT solar cells exhibit a higher theoretical efficiency, they suffer from notable UV-induced degradation. Unlike other cell types, the amorphous silicon/microcrystalline silicon layer in HJT solar cells is easily to be damaged by ultraviolet (UV) radiation, resulting in surface defects. Consequently, HJT solar cells degrade more rapidly compared with other solar cell types, leading to a decline in the photovoltaic conversion efficiency of the photovoltaic modules.

One of the current solutions is to reduce the thickness of the amorphous silicon/microcrystalline silicon layer in HJT solar cells, which however does not effectively reduce the UV-induced degradation. Another strategy is to incorporate a UV cutoff film or a UV light conversion film during encapsulation of HJT solar cells and assembly of photovoltaic modules. Nonetheless, this solution presents challenges such as decreased electrical performance of the modules, yellowing of the encapsulant, and increased production costs. Additionally, due to the higher light absorption loss of the front amorphous silicon/microcrystalline silicon layer, HJT solar cells also have lower short-circuit current compared with other cell types.

SUMMARY

In view of this, there is a need to provide a solar cell, a preparation method thereof, and a photovoltaic module.

In a first aspect of the present application, a solar cell is provided. In an embodiment of the present application, the solar cell includes a semiconductor substrate, a first substrate doped layer, a second substrate doped layer, a first passivation layer, and a first doped semiconductor layer; the semiconductor substrate includes a first surface, and the first surface includes a first region and a second region adjacent to the first region along a first direction; the first substrate doped layer is located in the first region; the second substrate doped layer is located in the second region, and the first substrate doped layer is connected to the second substrate doped layer; the first passivation layer is located on a side of the second substrate doped layer away from the semiconductor substrate; the first doped semiconductor layer is located on a side of the first passivation layer away from the semiconductor substrate; the doping type of the semiconductor substrate is opposite to the doping type of the first substrate doped layer; the doping types of the first substrate doped layer, the second substrate doped layer, and the first doped semiconductor layer are the same; the first region is a non-metal contact region, and the second region is a metal contact region.

According to the above embodiment of the solar cell, the first passivation layer and the first doped semiconductor layer are disposed on the surface of the second substrate doped layer only in the second region, and no semiconductor layer is disposed on the surface of the first substrate doped layer in the first region, which greatly reduces the area of the semiconductor layer on the front side (i.e., the light-receiving side) of the solar cell. On the one hand, the area of the semiconductor layer, which is disposed on the front side of the HJT solar cell and prone to be damaged by UV radiation, is greatly reduced, thereby reducing the damages to the front side of the cell caused by UV radiation and thus alleviating the photovoltaic conversion efficiency degradation of the HJT solar cell. On the other hand, the area of the semiconductor layer, which is disposed on the front side of the HJT solar cell and causes a great loss of light absorption, is significantly reduced, thereby reducing the loss of light absorption on the front side of the HJT solar cell and enhancing the short-circuit current and photovoltaic conversion efficiency of the HJT solar cell. Additionally, the front side of the HJT solar cell does not need a transparent electrically conducting layer, thereby reducing the preparation costs of the HJT solar cell.

Moreover, in some embodiments of the present application, the solar cell can further possess the following additional technical features. In some embodiments, the first passivation layer includes a tunnel oxide layer, and the first doped semiconductor layer includes a doped polysilicon layer. Alternatively, the first passivation layer includes a first intrinsic amorphous silicon layer, and the first doped semiconductor layer includes at least one of a first doped amorphous silicon layer, a first doped nanocrystalline silicon layer, or a first doped microcrystalline silicon layer. All of the above embodiments can reduce the damages caused by UV radiation to the front side of the cell, alleviate the photovoltaic conversion efficiency degradation of the HJT solar cell, reduce the loss of light absorption on the front side of the HJT solar cell, and enhance the short-circuit current and photovoltaic conversion efficiency of the HJT solar cell.

In some embodiments of the present application, the semiconductor substrate is an n-type doped substrate, and the first substrate doped layer, the second substrate doped layer, and the first doped semiconductor layer are all p-type doped layers. Alternatively, the semiconductor substrate is a p-type doped substrate, and the first substrate doped layer, the second substrate doped layer, and the first doped semiconductor layer are all n-type doped layers. As such, electron holes can be prevented from being transported to the back side of the solar cell, thereby reducing carrier recombination and lowering the requirements for substrate quality and process control.

In some embodiments of the present application, the thickness of the first substrate doped layer and the thickness of the second substrate doped layer are independently in a range from 0.01 µm to 2 µm. As such, it is ensured that the first substrate doped layer and the second substrate doped layer can have relatively good lateral carrier transport capability.

In some embodiments of the present application, the sheet resistances of the first substrate doped layer and the second substrate doped layer are independently in a range from 50 Ohm/sq to 500 Ohm/sq. As such, it is further ensured that the first substrate doped layer and the second substrate doped layer can have relatively good lateral carrier transport capability.

In some embodiments of the present application, the thickness of the first passivation layer is in a range from 0.5 nm to 3 nm; and/or the first passivation layer is made of silicon oxide, aluminum oxide, or a combination thereof. As such, it is further ensured that the first passivation layer achieves a relatively good passivation contact effect.

In some embodiments of the present application, the thickness of the first doped semiconductor layer is in a range from 10 nm to 500 nm. As such, it is further ensured that the first doped semiconductor layer achieves a relatively good passivation contact effect, thereby reducing the carrier recombination in the metal contact region.

In some embodiments of the present application, the ratio of the dimension of an individual first region along the first direction to the dimension of an individual second region along the first direction is in a range from 10:1 to 200:1. As such, the damages to the front side of the HJT solar cell caused by UV radiation are reduced, the photovoltaic conversion efficiency degradation of the HJT solar cell is alleviated, the loss of light absorption on the front side of the HJT solar cell is reduced, and the short-circuit current and photovoltaic conversion efficiency of the HJT solar cell are enhanced.

In some embodiments of the present application, the first surface is a textured surface, which includes a pyramid texture and/or an etch-pit texture. As such, the light reflection on the first surface of the semiconductor substrate can be reduced, and thus the short-circuit current of the solar cell can be further enhanced.

In some embodiments of the present application, the solar cell further includes a first passivation anti-reflection layer, which is disposed on a side of the first substrate doped layer away from the semiconductor substrate. As such, the first passivation anti-reflection layer reduces light reflection on the front side of the HJT solar cell, increases photocurrent, thereby enhancing the photovoltaic conversion efficiency of the HJT solar cell. In addition, the first passivation anti-reflection layer also provides protection and passivation for the solar cell.

In some embodiments of the present application, the solar cell further includes a second passivation anti-reflection layer and a first electrode; the second passivation anti-reflection layer is disposed on at least part of a surface of the first doped semiconductor layer away from the semiconductor substrate; the first electrode penetrates the second passivation anti-reflection layer and is in direct contact with the first doped semiconductor layer to form an electrical connection, or the first electrode is disposed on at least part of a surface of the second passivation anti-reflection layer away from the semiconductor substrate, forming an electrical connection with the first doped semiconductor layer through the second passivation anti-reflection layer. As such, the second passivation anti-reflection layer reduces light reflection on the front side of the HJT solar cell, increases photocurrent, thereby enhancing the photovoltaic conversion efficiency of the HJT solar cell. In addition, the second passivation anti-reflection layer also provides protection and passivation to the solar cell.

In some embodiments of the present application, the thickness of the first passivation anti-reflection layer is in a range from 50 nm to 150 nm; and/or the first passivation anti-reflection layer is made of aluminum oxide, silicon oxide, silicon nitride, silicon oxynitride, silicon carbide, magnesium fluoride, indium tin oxide, aluminum-doped zinc oxide, hydrogenated indium oxide, indium tungsten oxide, or any combination thereof. As such, the loss of light absorption on the front side of the HJT solar cell is further reduced.

In some embodiments of the present application, the thickness of the second passivation anti-reflection layer is in a range from 50 nm to 150 nm; and/or the second passivation anti-reflection layer is made of aluminum oxide, silicon oxide, silicon nitride, silicon oxynitride, silicon carbide, magnesium fluoride, indium tin oxide, aluminum-doped zinc oxide, hydrogenated indium oxide, indium tungsten oxide, or any combination thereof. As such, the loss of light absorption on the front side of the HJT solar cell is further reduced.

In some embodiments of the present application, the first electrode is made of silver, copper, gold, aluminum, tin, titanium, a silver compound, a copper compound, a gold compound, an aluminum compound, a tin compound, a titanium compound, or any combination thereof.

In some embodiments of the present application, the solar cell further includes a second passivation layer, a second doped semiconductor layer, an electrically conducting layer, and a second electrode; the second passivation layer is disposed on a second surface of the semiconductor substrate, the second surface being opposite to the first surface; the second doped semiconductor layer is disposed on a side of the second passivation layer away from the semiconductor substrate; the electrically conducting layer is disposed on a side of the second doped semiconductor layer away from the semiconductor substrate; the second electrode forms an electrical connection with the electrically conducting layer.

In some embodiments of the present application, the doping types of the second doped semiconductor layer and the semiconductor substrate are the same.

In some embodiments of the present application, the second doped semiconductor layer includes at least one of a second doped amorphous silicon layer, a second doped nanocrystalline silicon layer, or a second doped microcrystalline silicon layer; the second passivation layer includes a second intrinsic amorphous silicon layer.

In some embodiments of the present application, the thickness of the second passivation layer is in a range from 1 nm to 15 nm.

In some embodiments of the present application, the thickness of the second doped semiconductor layer is in a range from 1 nm to 50 nm.

In some embodiments of the present application, the thickness of the electrically conducting layer is in a range from 20 nm to 200 nm; and/or the electrically conducting layer is made of indium tin oxide, aluminum-doped zinc oxide, hydrogenated indium oxide, indium tungsten oxide, or any combination thereof.

In some embodiments of the present application, the second electrode is made of silver, copper, gold, aluminum, tin, titanium, a silver compound, a copper compound, a gold compound, an aluminum compound, a tin compound, a titanium compound, or any combination thereof.

In a second aspect of the present application, a method for preparing a solar cell is provided. In an embodiment of the present application, the method includes providing a semiconductor substrate including a first surface, the first surface including a first region and a second region adjacent to the first region along a first direction; forming a first substrate doped layer in the first region, and forming a second substrate doped layer in the second region; forming a first passivation layer on a side of the second substrate doped layer away from the semiconductor substrate; forming a first doped semiconductor layer on a side of the first passivation layer away from the semiconductor substrate; where the doping type of the semiconductor substrate is opposite to the doping type of the first substrate doped layer; the doping types of the first substrate doped layer, the second substrate doped layer, and the first doped semiconductor layer are the same; the first region is a non-metal contact region, and the second region is a metal contact region.

According to the above embodiment of the method for preparing the solar cell, the first passivation layer and the first doped semiconductor layer are formed only on the surface of the second substrate doped layer in the second region, and no semiconductor layer is formed on the surface of the first substrate doped layer in the first region, which greatly reduces the area of the semiconductor layer on the front side of the solar cell. On the one hand, this method greatly reduces the area of the semiconductor layer, which is prone to be damaged by UV radiation, on the front side of the HJT solar cell, thereby reducing the damages to the front side of the cell caused by UV radiation and thus alleviating the photovoltaic conversion efficiency degradation of the HJT solar cell. On the other hand, it significantly reduces the area of the semiconductor layer, which causes a great loss of light absorption, on the front side of the HJT solar cell, thereby reducing the loss of light absorption on the front side of the HJT solar cell and enhancing the short-circuit current and photovoltaic conversion efficiency of the HJT solar cell. Additionally, the front side of the HJT solar cell does not need a transparent electrically conducting layer, thereby reducing the preparation costs of the HJT solar cell.

Moreover, in some embodiments of the present application, the method for preparing the solar cell can further possess the following additional technical features. In some embodiments, the method further includes forming a first passivation anti-reflection layer on a side of the first substrate doped layer away from the semiconductor substrate.

In some embodiments of the present application, the method further includes: forming a second passivation anti-reflection layer on at least part of a surface of the first doped semiconductor layer away from the semiconductor substrate; forming a first electrode on at least part of a surface of the second passivation anti-reflection layer away from the semiconductor substrate, where the first electrode penetrates the second passivation anti-reflection layer and is in direct contact with the first doped semiconductor layer to form an electrical connection, or forming a first electrode on at least part of a surface of the second passivation anti-reflection layer away from the semiconductor substrate, where the first electrode forms an electrical connection with the first doped semiconductor layer through the second passivation anti-reflection layer. As such, the first and second passivation anti-reflection layers reduce light reflection on the front side of the HJT solar cell, increase photocurrent, thereby enhancing the photovoltaic conversion efficiency of the HJT solar cell. In addition, the first and second passivation anti-reflection layers also provide protection and passivation to the solar cell.

In some embodiments of the present application, the method further includes: forming a second passivation layer on a second surface of the semiconductor substrate, the second surface being opposite to the first surface; forming a second doped semiconductor layer on a side of the second passivation layer away from the semiconductor substrate; forming an electrically conducting layer on a side of the second doped semiconductor layer away from the semiconductor substrate; forming a second electrode on at least part of a surface of the electrically conducting layer away from the semiconductor substrate.

In a third aspect of the present application, a photovoltaic module is provided. In an embodiment of the present application, the photovoltaic module includes the solar cell described in any above embodiment or the solar cell prepared by the method described in any above embodiment. As such, the solar cell in the photovoltaic module has alleviated photovoltaic conversion efficiency degradation and enhanced short-circuit current and photovoltaic conversion efficiency.

Additional aspects and advantages of the present application are partly provided in the following description, become apparent from the following description, or learned by practice of the present application.

BRIEF DESCRIPTION OF THE DRAWINGS

The above and/or additional aspects and advantages of the present application will become clear and understandable from the drawings, which are briefly described below.

Figure 1:
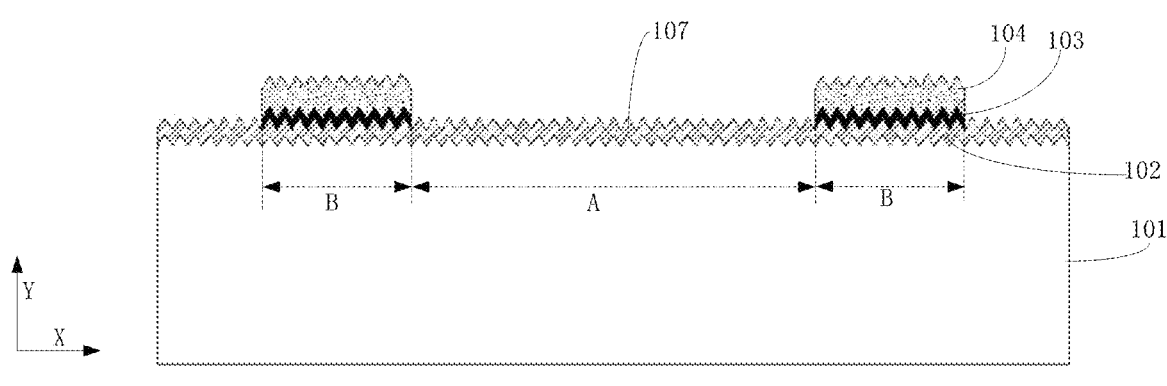
FIG. 1 is schematic structural view of a solar cell according to some embodiments of the present application.

REFERENCE SIGNS 101, semiconductor substrate; 101-1, first surface; 101-2, second surface; 102, second substrate doped layer; 103, first passivation layer; 104, first doped semiconductor layer; 105, second passivation anti-reflection layer; 106, first electrode; 107, first substrate doped layer; 108, first passivation anti-reflection layer; 109, second passivation layer; 110, second doped semiconductor layer; 111, electrically conducting layer; 112, second electrode.

DETAILED DESCRIPTION

The embodiments of the present application are described in detail below, and some embodiments are exemplarily illustrated in the accompanying drawings. Throughout the description, the same or similar reference signs denote the same or similar elements, or elements having the same or similar functions. The exemplary embodiments described below with reference to the drawings are illustrative and intended to explain the present application, and should not be construed as limiting the present application. In the description of the present application, it should be understood that the terms "central", "longitudinal", "transverse", "length", "width", "thickness", "upper", "lower", "front", "rear", "left", "right", "vertical", "horizontal", "top", "bottom", "inner", "outer", "axial", "radial", "circumferential", etc. indicate the orientations or positional relationships on the basis of the drawings. These terms are only for describing the present application and simplifying the description, rather than indicating or implying that the related devices or elements must have the specific orientations, or be constructed or operated in the specific orientations, and therefore cannot be understood as limitations of the present application. In addition, the terms "first" and "second" are used merely as labels to distinguish one element having a certain name from another element having the same name, and cannot be understood as indicating or implying any priority, precedence, or order of one element over another, or indicating the quantity of the element. Therefore, the element modified by "first" or "second" may explicitly or implicitly includes at least one of the elements. In the description of the present application, "a plurality of" means at least two, such as two, three, etc., unless otherwise specifically defined. In the present application, unless otherwise clearly specified and defined, the terms "installed", "connected", "coupled", "fixed" and the like should be interpreted broadly. For example, an element, when being referred to as being "installed", "connected", "coupled", "fixed" to another element, unless otherwise specifically defined, may be fixedly connected, detachably connected, or integrated to the other element, may be mechanically connected or electrically connected to the other element, and may be directly connected to the other element or connected to the other element via an intermediate element. For those of ordinary skill in the art, the specific meanings of the above-mentioned terms in the present application can be understood according to specific circumstances. In the present application, unless otherwise specifically defined, an element, when being referred to as being located "on" or "under" another element, may be in direct contact with the other element or contact the other element via an intermediate element. Moreover, the element, when being referred to as being located "on", "above", "over" another element, may be located right above or obliquely above the other element, or merely located at a horizontal level higher than the other element; the element, when being referred to as being located "under", "below", "beneath" another element, may be located right below or obliquely below the other element, or merely located at a horizontal level lower than the other element.

Figure 2:
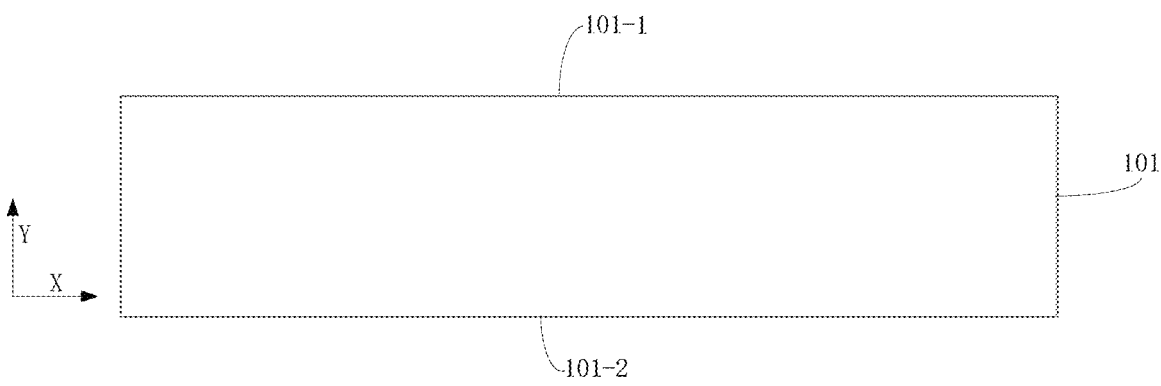
FIG. 2 is schematic structural view of a semiconductor substrate according to some embodiments of the present application.

In a first aspect of the present application, a solar cell is provided. Referring to FIGS. 1 and 2, an embodiment of the solar cell includes a semiconductor substrate 101, a first substrate doped layer 107, a second substrate doped layer 102, a first passivation layer 103, and a first doped semiconductor layer 104. The semiconductor substrate 101 includes a first surface 101-1. The first surface 101-1 includes a first region (e.g., region A as shown in FIG. 1) and a second region (e.g., regions B as shown in FIG. 1) adjacent to the first region A along a first direction (e.g., direction X as shown in FIG. 1). When there are multiple first and/or second regions A, B, except the regions at the edges of the first surface 101-1, each first region A is located between two adjacent second regions B, and each second region B is located between two adjacent first regions A. The first substrate doped layer 107 is located in the first region A. The second substrate doped layer 102 is located in the second region B. The first substrate doped layer 107 is connected to the second substrate doped layer 102. The first passivation layer 103 is located on a side of the second substrate doped layer 102 away from the semiconductor substrate 101. The first doped semiconductor layer 104 is located on a side of the first passivation layer 103 away from the semiconductor substrate 101. The first passivation layer 103 and the first doped semiconductor layer 104 are disposed on the surface of the second substrate doped layer 102 only in the second region B (also referred to as a metal contact region), and no semiconductor layer is disposed on the surface of the first substrate doped layer in the first region A (also referred to as a non-metal contact region). Thus, the area of the semiconductor layer on the front side of the solar cell is significantly reduced. On the one hand, the area of the semiconductor layer, which is disposed on the front side of the HJT solar cell and prone to be damaged by UV radiation, is greatly reduced, thereby reducing the damages to the front side of the cell caused by UV radiation and thus alleviating the photovoltaic conversion efficiency degradation of the HJT solar cell. On the other hand, the area of the semiconductor layer, which is disposed on the front side of the HJT solar cell and causes a great loss of light absorption, is significantly reduced, thereby reducing the loss of light absorption on the front side of the HJT solar cell and enhancing the short-circuit current and photovoltaic conversion efficiency of the HJT solar cell. Additionally, the front side of the HJT solar cell needs no transparent electrically conducting layer, thereby reducing the preparation costs of the HJT solar cell.

The first direction, e.g., the direction X in FIG. 1, refers to a length direction or a width direction of the solar cell, while a direction Y in FIG. 1 refers to a thickness direction of the solar cell. The principle behind the beneficial effects achieved by the solar cell provided in the present application will be elaborated below:

In related art, HJT solar cells each have a symmetrical bifacial cell structure with n-type monocrystalline silicon in the middle. An intrinsic amorphous silicon layer and an n-type amorphous or microcrystalline silicon layer are sequentially deposited on the front side of the n-type monocrystalline silicon, thus forming a front surface field. An intrinsic amorphous silicon layer and a p-type amorphous or microcrystalline silicon layer are sequentially deposited on the back side of the n-type monocrystalline silicon, thus forming a p-n junction. However, in the above structure of the HJT solar cell, the amorphous/microcrystalline silicon layer on the front side is prone to be damaged by UV radiation, resulting in surface defects and a rapid degradation in photovoltaic conversion efficiency, and thus causing a rapid degradation in the photovoltaic conversion efficiency of photovoltaic module assembled from the HJT solar cell. The front side of an HJT solar cell refers to a light-receiving side, while the back side refers to a side away from light.

Furthermore, the amorphous/microcrystalline silicon layer on the front side of the HJT solar cell can induce a great loss of light absorption, and thus the HJT solar cell has a relatively low short-circuit current.

To address these issues, in embodiments of the present application, the first surface 101-1 of the semiconductor substrate 101 is divided into the first region(s) A (also referred to as a non-metal contact region) and the second region(s) B (also referred to as a metal contact region). The first substrate doped layer 107 is located in the first region A, the second substrate doped layer 102 is located in the second region B, and the first substrate doped layer 107 is connected to the second substrate doped layer 102, enabling lateral (i.e., along the first direction) carrier transport between the first substrate doped layer 107 and the second substrate doped layer 102. Moreover, the first passivation layer 103 is located on the side of the second substrate doped layer 102 away from the semiconductor substrate 101, and the first doped semiconductor layer 104 is located on the side of the first passivation layer 103 away from the semiconductor substrate 101, thereby improving the passivation contact effect, reducing the carrier recombination in the second region B, and thus ensuring the open-circuit voltage and the photovoltaic conversion efficiency of the HJT solar cell. The doping type of the semiconductor substrate 101 is opposite to the doping type of the first substrate doped layer 107. The doping types of the first substrate doped layer 107, the second substrate doped layer 102, and the first doped semiconductor layer 104 are identical with each other. The first passivation layer 103 and the first doped semiconductor layer 104 are disposed on the surface of the second substrate doped layer 102 only in the second region B, and no semiconductor layer is disposed on the surface of the first substrate doped layer 107 in the first region A. Thus, the area of the semiconductor layer disposed on the front side of the solar cell is significantly reduced. On the one hand, the area of the semiconductor layer, which is disposed on the front side of the HJT solar cell and prone to be damaged by UV radiation, is greatly reduced, thereby reducing the damage to the front side of the cell caused by UV radiation and thus alleviating the photovoltaic conversion efficiency degradation of the HJT solar cell. On the other hand, the area of the semiconductor layer, which is disposed on the front side of the HJT solar cell and causes a great loss of light absorption, on the front side of the HJT solar cell, is significantly reduced, thereby reducing the loss of light absorption on the front side of the HJT solar cell and enhancing the short-circuit current and photovoltaic conversion efficiency of the HJT solar cell. Additionally, the front side of the HJT solar cell needs no transparent electrically conducting layer, thereby reducing the preparation costs of the HJT solar cell. Furthermore, the connected first and second substrate doped layers 107, 102 have relatively good lateral carrier transport capability. Thus, multiple first electrodes can be disposed only in multiple metal contact regions, and the distance between adjacent metal contact regions may be increased, thus reducing the number of the first electrodes, and reducing the costs for forming the first electrodes.

Referring to FIG. 2, the side where the first surface 101-1 of the semiconductor substrate 101 is located is the front side of the HJT solar cell, while the side where a second surface 101-2 of the semiconductor substrate 101 is located is the back side of the HJT solar cell, and the second surface 101-2 is opposite to the first surface 101-1. In the embodiments of the present application, the first passivation layer 103 can include a tunnel oxide layer, and the first doped semiconductor layer 104 can include a doped polysilicon layer.

Alternatively, the first passivation layer 103 can include a first intrinsic amorphous silicon layer, and the first doped semiconductor layer 104 can include at least one of a first doped amorphous silicon layer, a first doped nanocrystalline silicon layer, or a first doped microcrystalline silicon layer. In the above embodiments, the first passivation layer 103 and the first doped semiconductor layer 104 are disposed on the surface of the second substrate doped layer only in the second region B, while no semiconductor layer is disposed on the surface of the first substrate doped layer 107 in the first region A. Therefore, all of the above embodiments can reduce the damages caused by UV radiation to the front side of the cell, alleviate the photovoltaic conversion efficiency degradation of the HJT solar cell, reduce the loss of light absorption on the front side of the HJT solar cell, and enhance the short-circuit current and photovoltaic conversion efficiency of the HJT solar cell.

In some embodiments, the first passivation layer 103 is a tunnel oxide layer, and the first doped semiconductor layer 104 is a doped polysilicon layer. As such, the combination of the intrinsic amorphous silicon layer and the doped amorphous/microcrystalline silicon layer in the metal contact region on the front side of a traditional HJT solar cell is replaced with the combination of the tunnel oxide layer and the doped polysilicon layer. Since the doped amorphous/microcrystalline silicon layer contains a large number of Si—H bonds, which are prone to break under UV irradiation, the doped amorphous/microcrystalline silicon layer is more susceptible to damages under UV irradiation, resulting in surface defects. In contrast, the doped polysilicon layer contains a large number of Si—Si bonds, which are more stable and less likely to break under UV irradiation. Therefore, replacing the traditional structure in the metal contact region on the front side of the HJT solar cell with the combination of the tunnel oxide layer and the doped polysilicon layer further reduces the damages from UV radiation, thereby further alleviating the photovoltaic conversion efficiency degradation of the HJT solar cell. Moreover, the localized arrangement of the doped polysilicon layer reduces the loss of light absorption, thereby further reducing the loss of light absorption on the front side of the HJT solar cell and enhancing the short-circuit current and photovoltaic conversion efficiency of the HJT solar cell. Additionally, the tunnel oxide layer and the doped polysilicon layer also can provide a relatively good passivation contact effect.

In some specific embodiments of the present application, the thickness of the first substrate doped layer 107 can be in a range from 0.01 μm to 2 μm (e.g., 0.01 μm, 0.05 μm, 0.1 μm, 0.5 μm, 1 μm, 1.5 μm, 2 μm, etc.), and optionally in a range from 0.2 μm to 0.8 μm. The thickness of the second substrate doped layer 102 can be in a range from 0.01 μm to 2 μm (e.g., 0.01 μm, 0.05 μm, 0.1 μm, 0.5 μm, 1 μm, 1.5 μm, 2 μm, etc.), and optionally in a range from 0.2 μm to 0.8 μm. By having the thickness of the first substrate doped layer 107 and the thickness of the second substrate doped layer 102 within the above ranges, the lateral carrier transport capability can be enhanced. Optionally, the thickness of the first substrate doped layer 107 is equal to the thickness of the second substrate doped layer 102. In some specific embodiments of the present application, the sheet resistance of the first substrate doped layer 107 can be in a range from 50 Ohm/sq to 500 Ohm/sq (e.g., 50 Ohm/sq, 100 Ohm/sq, 150 Ohm/sq, 200 Ohm/sq, 250 Ohm/sq, 300 Ohm/sq, 350 Ohm/sq, 400 Ohm/sq, 450 Ohm/sq, 500 Ohm/sq, etc.), and optionally in a range from 200 Ohm/sq to 300 Ohm/sq; the sheet resistance of the second substrate doped layer 102 can be in a range from 50 Ohm/sq to 500 Ohm/sq (e.g., 50

Ohm/sq, 100 Ohm/sq, 150 Ohm/sq, 200 Ohm/sq, 250 Ohm/sq, 300 Ohm/sq, 350 Ohm/sq, 400 Ohm/sq, 450 Ohm/sq, 500 Ohm/sq, etc.), and optionally in a range from 200 Ohm/sq to 300 Ohm/sq. By having the sheet resistance of the first substrate doped layer 107 and the sheet resistance of the second substrate doped layer 102 within the above ranges, the lateral carrier transport capability can be enhanced. Optionally, the sheet resistance of the first substrate doped layer 107 is equal to the sheet resistance of the second substrate doped layer 102.

In some specific embodiments of the present application, the thickness of the first passivation layer 103 can be in a range from 0.5 nm to 3 nm (e.g., 0.5 nm, 1 nm, 1.5 nm, 2 nm, 2.5 nm, 3 nm, etc.). By having the thickness of the first passivation layer 103 within the above range, the first passivation layer 103 can achieve a relatively good passivation contact effect. Moreover, when the first passivation layer 103 is a tunnel oxide layer, the majority carriers therein can have a tunneling effect. In the embodiments of the present application, the specific type of the first passivation layer 103 is not particularly limited and can be selected by those skilled in the art according to practical needs. As some specific examples, the first passivation layer 103 is made of silicon oxide, aluminum oxide, or a combination thereof. For example, the first passivation layer 103 is a tunnel $SiO_2$ layer.

In some specific embodiments of the present application, the thickness of the first doped semiconductor layer 104 can be in a range from 10 nm to 500 nm (e.g., 10 nm, 100 nm, 200 nm, 300 nm, 400 nm, 500 nm, etc.). By having the thickness of the first doped semiconductor layer 104 within the above range, the first doped semiconductor layer 104 can achieve a relatively good passivation contact effect, reducing the carrier recombination in the metal contact region. Moreover, by confining the thickness of the first doped semiconductor layer 104 within the above range, the damages to the front side of the solar cell caused by UV radiation can be further reduced, thus mitigating the degradation of the photovoltaic conversion efficiency of the HJT solar cell. Additionally, the loss of light absorption on the front side of the HJT solar cell is further reduced, and the short-circuit current and photovoltaic conversion efficiency of the HJT solar cell are enhanced.

In some specific embodiments of the present application, the ratio of the dimension of an individual first region A along the first direction to the dimension of an individual second region B along the first direction can be in a range from 10:1 to 200:1 (e.g., 10:1, 20:1, 40:1, 60:1, 80:1, 100:1, 120:1, 140:1, 160:1, 180:1, 200:1, etc.), and optionally in a range from 20:1 to 100:1. The area of the non-metal contact region can be significantly larger than that of the metal contact region. In other words, the majority of the area of the substrate doped layers disposed on the front side of the HJT solar cell is devoid of any semiconductor layers. The area of the semiconductor layer, which is disposed on the front side of the HJT solar cell and prone to be damaged by UV radiation, is greatly reduced, thereby reducing the damages to the front side of the cell caused by UV radiation, and alleviating the photovoltaic conversion efficiency degradation of the HJT solar cell. Additionally, the area of the semiconductor layer, which is disposed on the front side of the HJT solar cell and causes a great loss of light absorption, is significantly reduced, thereby reducing the loss of light absorption on the front side of the HJT solar cell and enhancing the short-circuit current and photovoltaic conversion efficiency of the HJT solar cell.

Figure 3:
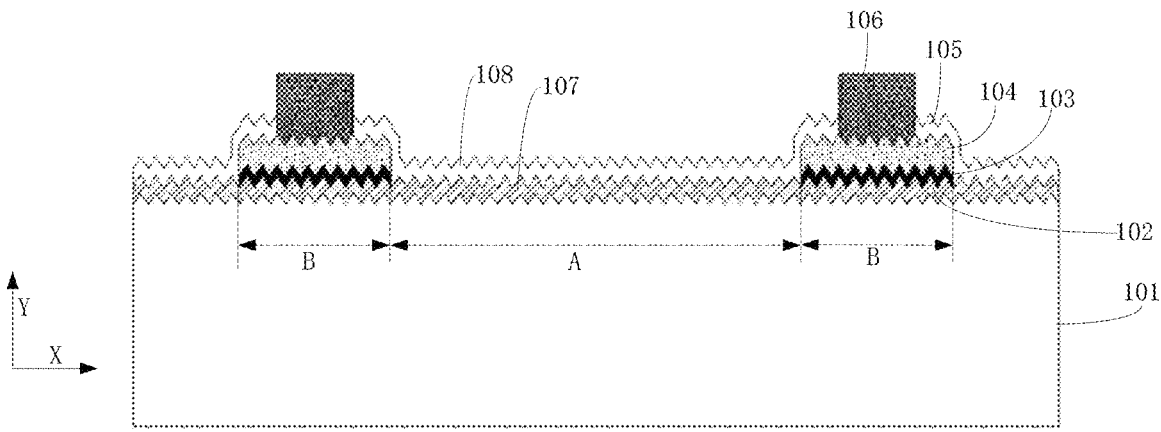
FIG. 3 is schematic structural view of a solar cell according to some other embodiments of the present application.

In some specific embodiments of the present application, referring to FIG. 3, the solar cell can further include a first passivation anti-reflection layer 108. The first passivation anti-reflection layer 108 is disposed on a side of the first substrate doped layer 107 away from the semiconductor substrate 101, i.e., on the surface of the first substrate doped layer 107 in the non-contact region without any semiconductor layer. The first passivation anti-reflection layer 108 directly covers the first substrate doped layer 107. This structure reduces light reflection on the front side of the HJT solar cell, thereby increasing the photocurrent and enhancing the photovoltaic conversion efficiency of the HJT solar cell. In addition, the first passivation anti-reflection layer 108 also provides protection and passivation for the solar cell.

In the embodiments of the present application, the thickness of the first passivation anti-reflection layer 108 is not particularly limited. As some specific examples, the thickness of the first passivation anti-reflection layer 108 can be in a range from 50 nm to 150 nm (e.g., 50 nm, 60 nm, 70 nm, 80 nm, 90 nm, 100 nm, 110 nm, 120 nm, 130 nm, 140 nm, 150 nm, etc.). By having the thickness of the first passivation anti-reflection layer 108 within the above range, the loss of light absorption on the front side of the HJT solar cell can be further reduced. In the embodiments of the present application, the material of the first passivation anti-reflection layer 108 is not particularly limited. As some specific examples, the material of the first passivation anti-reflection layer 108 can be, but are not limited to, aluminum oxide, silicon oxide, silicon nitride, silicon oxynitride, silicon carbide, magnesium fluoride, indium tin oxide, aluminum-doped zinc oxide, hydrogenated indium oxide, indium tungsten oxide, or any combination thereof.

In some specific embodiments of the present application, referring to FIG. 3, the solar cell can further include a second passivation anti-reflection layer 105 and a first electrode 106. The second passivation anti-reflection layer 105 is disposed on at least part of a surface of the first doped semiconductor layer 104 away from the semiconductor substrate 101. The first electrode 106 penetrates through the second passivation anti-reflection layer 105 and is in direct contact with the first doped semiconductor layer 104 to form an electrical connection. Alternatively, the first electrode 106 is disposed on at least part of the surface of the second passivation anti-reflection layer 105 away from the semiconductor substrate 101 to form an electrical connection with the first doped semiconductor layer 104 through the second passivation anti-reflection layer 105. By disposing the second passivation anti-reflection layer 105 on the surface of the first doped semiconductor layer 104, the light reflection on the front side of the HJT solar cell can be reduced, thereby increasing the photocurrent and enhancing the photovoltaic conversion efficiency of the HJT solar cell. In addition, the second passivation anti-reflection layer 105 also provides protection and passivation for the solar cell.

In the embodiments of the present application, the thickness of the second passivation anti-reflection layer 105 is not particularly limited. As some specific examples, the thickness of the second passivation anti-reflection layer 105 can be in a range from 50 nm to 150 nm (e.g., 50 nm, 60 nm, 70 nm, 80 nm, 90 nm, 100 nm, 110 nm, 120 nm, 130 nm, 140 nm, 150 nm, etc.). By having the thickness of the second passivation anti-reflection layer 105 within the above range, the loss of light absorption on the front side of the HJT solar cell can be further reduced. In the embodiments of the present application, the material of the second passivation anti-reflection layer 105 is not particularly limited. As some specific examples, the material of the second passivation anti-reflection layer 105 can include, but are not limited to, aluminum oxide, silicon oxide, silicon nitride, silicon oxynitride, silicon carbide, magnesium fluoride, indium tin oxide, aluminum-doped zinc oxide, hydrogenated indium oxide, and indium tungsten oxide, or any combination thereof. Optionally, the first passivation anti-reflection layer 108 and the second passivation anti-reflection layer 105 have the same thickness and are made of the same material.

In the embodiments of the present application, the material of the first electrode 106 is not particularly limited. As some specific examples, the material of the first electrode 106 can include, but is not limited to, silver, copper, gold, aluminum, tin, titanium, a silver compound, a copper compound, a gold compound, an aluminum compound, a tin compound, a titanium compound, or any combination thereof.

Figure 4:
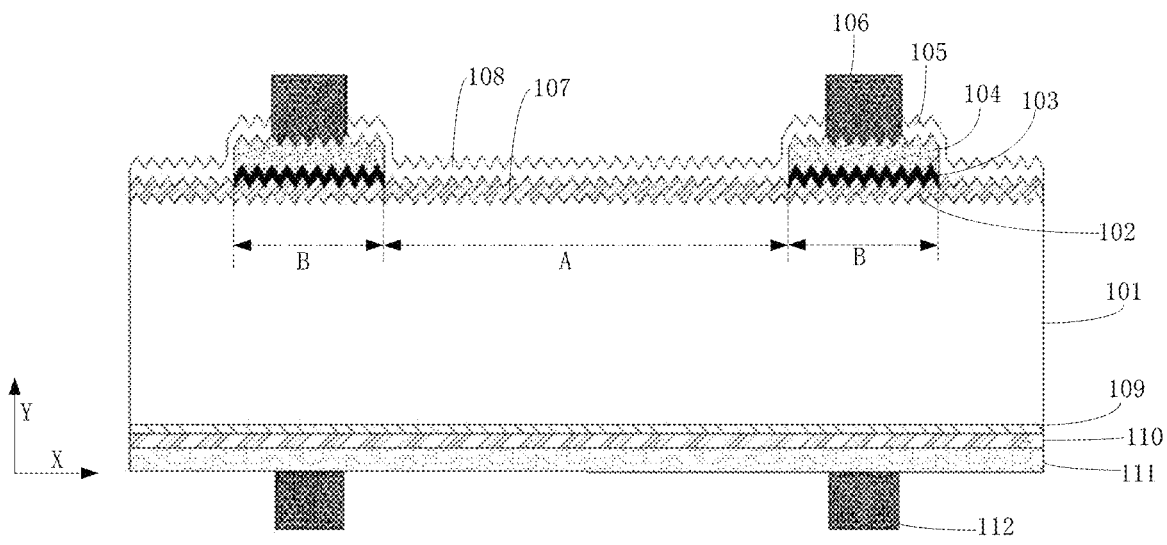
FIG. 4 is schematic structural view of a solar cell according to some other embodiments of the present application.

In some specific embodiments of the present application, referring to FIG. 4, the solar cell can further include a second passivation layer 109, a second doped semiconductor layer 110, an electrically conducting layer 111, and a second electrode 112. The second passivation layer 109 is disposed on the second surface 101-2 of the semiconductor substrate 101. The second surface 101-2 is opposite to the first surface 101-1. The second doped semiconductor layer 110 is disposed on a side of the second passivation layer 109 away from the semiconductor substrate 101. The electrically conducting layer 111 is disposed on a side of the second doped semiconductor layer 110 away from the semiconductor substrate 101. The second electrode 112 forms an electrical connection with the electrically conducting layer 111. The second passivation layer 109 can passivate the surface of the silicon substrate. The doping type of the second doped semiconductor layer 110 is the same as that of the semiconductor substrate 101, and a back surface field is formed between the second doped semiconductor layer 110 and the semiconductor substrate 101. The electrically conducting layer 111 enhances the electrical conductivity between the second doped semiconductor layer 110 and the second electrode 112 as well as the lateral charge carrier transport capability along the first direction.

In some specific embodiments of the present application, the doping type of the semiconductor substrate 101 is opposite to the doping type of the first substrate doped layer 107, and the doping type of the semiconductor substrate 101 is opposite to the doping type of the second substrate doped layer 102. The doping type of the first substrate doped layer 107 and the doping type of the second substrate doped layer 102 are the same as the doping type of the first doped semiconductor layer 104. Additionally, the doping type of the second doped semiconductor layer 110 is the same as the doping type of the semiconductor substrate 101. Accordingly, p-n junctions are formed between the semiconductor substrate 101 and the first substrate doped layer 107, and between the semiconductor substrate 101 and the second substrate doped layer 102, respectively. In other words, the p-n junctions are positioned on the front side of the solar cell.

Specifically, there are two approaches to position the p-n junctions on the front side of the solar cell. In the first approach, the semiconductor substrate 101 is made of n-type monocrystalline silicon; the first substrate doped layer 107, the second substrate doped layer 102, and the first doped semiconductor layer 104 are all p-type doped (e.g., doped with boron); the second doped semiconductor layer 110 is n-type doped (e.g., doped with phosphorus). In this case, the p-n junctions are formed between the n-type doped semiconductor substrate 101 and the p-type doped first substrate doped layer 107, and between the n-type doped semiconductor substrate 101 and the p-type doped the second substrate doped layer 102, while the back surface field is formed between the n-type doped semiconductor substrate 101 and the n-type doped second doped semiconductor layer 110. In the second approach, the semiconductor substrate 101 is made of p-type monocrystalline silicon; the first substrate doped layer 107, the second substrate doped layer 102, and the first doped semiconductor layer 104 are all n-type doped (e.g., doped with phosphorus); the second doped semiconductor layer 110 is p-type doped (e.g., doped with boron). In this case, the p-n junctions are formed between the p-type doped semiconductor substrate 101 and the n-type doped first substrate doped layer 107, and between the p-type doped semiconductor substrate 101 and the n-type doped second substrate doped layer 102, respectively, while the back surface field is formed between the p-type doped semiconductor substrate 101 and the p-type doped second doped semiconductor layer 110.

In the embodiments of the present application, when the semiconductor substrate 101 is n-type doped, the p-n junctions can be positioned either on the front side or the back side of the solar cell. In some embodiments, the p-n junctions are positioned on the front side of the solar cell. In this case, electron holes can be prevented from being transported to the back side of the solar cell, thereby reducing carrier recombination and lowering the requirements for substrate quality and process control. When the semiconductor substrate 101 is n-type doped and the p-n junctions are positioned on the front side of the solar cell, the second doped semiconductor layer 110 is n-type doped, i.e., the n-type doped second doped semiconductor layer 110 is disposed on the back side. Compared with the p-type doped second doped semiconductor layer 110, the n-type doped second doped semiconductor layer 110 can be thinner, thereby reducing the loss of light absorption, enhancing the short-circuit current, and reducing the requirement for the second electrodes 112. Accordingly, the number of the second electrodes 112 can be reduced, thereby reducing the shading of light on the back side, and thus further enhancing the short-circuit current. In addition, as less second electrodes 112 are required, the material for forming the second electrode 112 can be saved, and the manufacturing cost can be reduced.

In the embodiments of the present application, the second doped semiconductor layer 110 can include at least one of a second doped amorphous silicon layer, a second doped nanocrystalline silicon layer, or a second doped microcrystalline silicon layer, and the second passivation layer 109 can include a second intrinsic amorphous silicon layer. As such, the short-circuit current and photovoltaic conversion efficiency of the solar cell are enhanced. As some specific examples, the second doped semiconductor layer 110 can include at least one of an n-type doped (e.g., phosphorus-doped) amorphous silicon layer, an n-type doped (e.g., phosphorus-doped) nanocrystalline silicon layer, or an n-type doped (e.g., phosphorus-doped) microcrystalline silicon layer. Alternatively, the second doped semiconductor layer 110 can include at least one of a p-type doped (e.g., boron-doped) amorphous silicon layer, a p-type doped (e.g., boron-doped) nanocrystalline silicon layer, or a p-type doped (e.g., boron-doped) microcrystalline silicon layer.

In the embodiments of the present application, the thickness of the second passivation layer 109 is not particularly limited. As some specific examples, the thickness of the second passivation layer 109 can be in a range from 1 nm to 15 nm (e.g., 1 nm, 3 nm, 5 nm, 7 nm, 9 nm, 11 nm, 13 nm, 15 nm, etc.). By having the thickness of the second passivation layer 109 within the above range, the passivation contact effect of the second passivation layer 109 on the semiconductor substrate 101 can be ensured.

In the embodiments of the present application, the thickness of the second doped semiconductor layer 110 is not particularly limited. As some specific examples, the thickness of the second doped semiconductor layer 110 can be in a range from 1 nm to 50 nm (e.g., 1 nm, 10 nm, 20 nm, 30 nm, 40 nm, 50 nm, etc.), and optionally in a range from 5 nm to 15 nm.

In the embodiments of the present application, the thickness of the electrically conducting layer 111 is not particularly limited. As some specific examples, the thickness of the electrically conducting layer 111 can be in a range from 20 nm to 200 nm (e.g., 20 nm, 50 nm, 80 nm, 100 nm, 140 nm, 180 nm, 200 nm, etc.).

In some embodiments of the present application, the electrically conducting layer 111 is configured to enhance the electrical conductivity between the second doped semiconductor layer 110 and the second electrode 112, as well as the lateral carrier transport capability along the first direction. The material of the electrically conducting layer 111 is not particularly limited. As some specific examples, the material of the electrically conducting layer 111 can include, but is not limited to, indium tin oxide, aluminum-doped zinc oxide, hydrogenated indium oxide, indium tungsten oxide, or any combination thereof. Similarly, the material of the second electrode 112 is not particularly limited. As some specific examples, the material of the second electrode 112 can include, but is not limited to, silver, copper, gold, aluminum, tin, titanium, a silver compound, a copper compound, a gold compound, an aluminum compound, a tin compound, a titanium compound, or any combination thereof.

In some embodiments of the present application, the first surface 101-1 includes a pyramid textured surface and/or an etch-pit textured surface; and/or the second surface 101-2 includes a pyramid textured surface and/or an etch-pit textured surface. Optionally, the first surface 101-1 includes a pyramid textured surface, and/or the second surface 101-2 includes a pyramid textured surface. As such, the light reflection on the first surface 101-1 and/or the second surface 101-2 of the semiconductor substrate 101 can be reduced, and thus the short-circuit current of the solar cell can be further enhanced.

Figure 5:
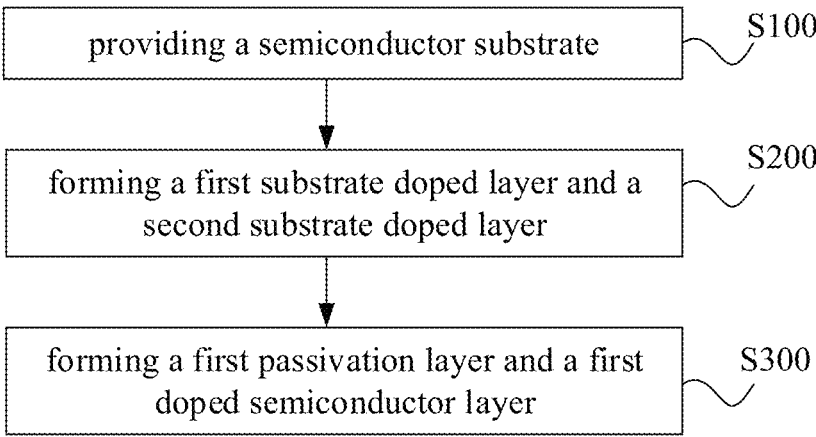
FIG. 5 is a flowchart of a method for preparing a solar cell according to some embodiments of the present application.

In a second aspect of the present application, a method for preparing the above-described solar cell is provided. According to some embodiments of the present application, referring to FIG. 5, the method includes S100 to S300.

In S100, a semiconductor substrate is provided.

In some embodiments of S100, a semiconductor substrate 101 is provided. The semiconductor substrate 101 includes a first surface 101-1 and a second surface 101-2 opposite to the first surface 101-1. Referring to FIGS. 1 to 2, the first surface 101-1 includes a first region (e.g., region A as shown in FIG. 1) and a second region (e.g., regions B as shown in FIG. 1) adjacent to the first region along a first direction (e.g., direction X as shown in FIG. 1).

In the embodiments of the present application, the material of the semiconductor substrate 101 can be selected from silicon (Si), germanium (Ge), or gallium arsenide (GaAs), etc., and is Si in some embodiments. Concerning the conductivity type, the semiconductor substrate 101 can be an n-type semiconductor substrate or a p-type semiconductor substrate, and in some embodiments, is made of n-type monocrystalline silicon. The first surface 101-1 is located at the side facing the incident light, while the second surface 101-2 is located at the back side of the solar cell. As some specific examples, the thickness of the semiconductor substrate 101 can be in a range from 80 μm to 250 μm (e.g., 80 μm, 100 μm, 120 μm, 140 μm, 150 μm, 180 μm, 200 μm, 220 μm, 250 μm, etc.), and optionally in a range from 100 μm to 200 μm.

The pristine semiconductor substrate 101 can be alkaline etched to remove contaminants from its surfaces and to form its surfaces with anti-reflection pyramid textures. In some embodiments, the alkaline etching solution can be a potassium hydroxide (KOH) solution with a mass concentration of 5.5% to 6.5%.

In S200, a first substrate doped layer and a second substrate doped layer are formed.

The first substrate doped layer 107 is formed in the first region A, and the second substrate doped layer 102 is formed in the second region B. The first substrate doped layer 107 and the second substrate doped layer 102 can be formed separately in the first region A and the second region B. When the first substrate doped layer 107 and the second substrate doped layer 102 are made of the same material, an integrated substrate doped layer can be formed on the first surface 101-1 of the semiconductor substrate 101, with its portion located in the first region A defined as the first substrate doped layer 107 and its portion located in the second region B defined as the second substrate doped layer 102. Thus, the first substrate doped layer 107 and the second substrate doped layer 102 can be formed simultaneously. It should be noted that charge carriers can be laterally (i.e., along the first direction) transferred between the first substrate doped layer 107 and the second substrate doped layer 102.

Specifically, the textured semiconductor substrate 101 can be placed in a tubular furnace to simultaneously diffuse dopants into the first region A and the second region B, thereby forming the first substrate doped layer 107 and the second substrate doped layer 102.

As some specific examples, the thicknesses of the first substrate doped layer 107 and the second substrate doped layer 102 can be independently in a range from 0.01 μm to 2 μm, and optionally in a range from 0.2 μm to 0.8 μm. Furthermore, as some specific examples, the sheet resistances of the first substrate doped layer 107 and the second substrate doped layer 102 can be independently in a range from 50 Ohm/sq to 500 Ohm/sq, and optionally in a range from 200 Ohm/sq to 300 Ohm/sq.

In S300, a first passivation layer and a first doped semiconductor layer are formed.

The first passivation layer 103 is formed on the side of the second substrate doped layer 102 away from the semiconductor substrate 101, and the first doped semiconductor layer 104 is formed on the side of the first passivation layer 103 away from the semiconductor substrate 101. The doping type of the semiconductor substrate 101 is opposite to the doping type of the first substrate doped layer 107; the doping types of the first substrate doped layer 107, the second substrate doped layer 102, and the first doped semiconductor layer 104 are the same. In the embodiments of the present application, the first passivation layer 103 can include a tunnel oxide layer, and the first doped semiconductor layer 104 can include a doped polysilicon layer. Alternatively, the first passivation layer 103 can include a first intrinsic amorphous silicon layer, and the first doped semiconductor layer 104 can include at least one of a first doped amorphous silicon layer, a first doped nanocrystalline silicon layer, or a first doped microcrystalline silicon layer. In the above embodiments, the first passivation layer 103 and the first doped semiconductor layer 104 are disposed on the surface of the second substrate doped layer 102 only in the second region B (also referred to as a metal contact region), while no semiconductor layer is disposed on the surface of the first substrate doped layer 107 in the first region A (also referred to as a non-metal contact region). Therefore, all of the above embodiments can reduce the damages caused by UV radiation to the front side of the solar cell, alleviate the photovoltaic conversion efficiency degradation of the HJT solar cell, reduce the loss of light absorption on the front side of the HJT solar cell, and enhance the short-circuit current and the photoelectric conversion efficiency of the HJT solar cell. Optionally, the first passivation layer 103 is a tunnel oxide layer, and the first doped semiconductor layer 104 is a doped polysilicon layer. As such, the combination of the intrinsic amorphous silicon layer and the doped amorphous/microcrystalline silicon layer in the metal contact region on the front side of a traditional HJT solar cell is replaced with the combination of the tunnel oxide layer and the doped polysilicon layer. The detailed reasons have been described for the embodiments of the solar cell, and are not repeated herein.

Specifically, when the first passivation layer 103 is a tunnel oxide layer (e.g., a tunnel $SiO_2$ layer) and the first doped semiconductor layer 104 is a doped polysilicon layer, the first passivation layer 103 can be formed by thermal oxidation, plasma-enhanced chemical vapor deposition (PECVD), a wet chemical method, etc., and the polysilicon layer can be formed by low-pressure chemical vapor deposition (LPCVD) or PECVD. In addition, the polysilicon layer can be in-situ doped or non-in-situ doped to form the doped polysilicon layer. Taking PECVD in-situ doping as an example, firstly, a doped microcrystalline silicon layer is formed on the tunnel oxide layer using PECVD, with the dopant being an n-type dopant, such as phosphorus. Then, the doped microcrystalline silicon layer is annealed at a high temperature in a range from 900 degrees Celsius to 930 degrees Celsius for several minutes, thereby being converted into the doped polysilicon layer. When the first passivation layer 103 is a first intrinsic amorphous silicon layer and the first doped semiconductor layer 104 is a first doped amorphous silicon layer, the first intrinsic amorphous silicon layer can be deposited using chemical vapor deposition (CVD), and then the first doped amorphous silicon layer is deposited on the first intrinsic amorphous silicon layer.

The first passivation layer 103 and the first doped semiconductor layer 104 corresponding to the first region A can be removed by using conventional techniques, such as laser, protective ink printing, etc., in the art, leaving only the first passivation layer 103 and the first doped semiconductor layer 104 corresponding to the second region B.

As some specific examples, the thickness of the first passivation layer 103 can be in a range from 0.5 nm to 3 nm. Similarly, the thickness of the first doped semiconductor layer 104 can be in a range from 10 nm to 500 nm.

According to the method for preparing the solar cell in the above-described embodiments of the present application, the first surface 101-1 of the semiconductor substrate 101 is divided into the first region(s) A (also referred to as a non-metal contact region) and the second region(s) B (also referred to as a metal contact region). The first substrate doped layer 107 is formed in the first region A, the second substrate doped layer 102 is formed in the second region B, and the first substrate doped layer 107 is connected to the second substrate doped layer 102, enabling lateral (i.e., along the first direction) electrical conduction between the first substrate doped layer 107 and the second substrate doped layer 102. Moreover, the first passivation layer 103 is formed on the side of the second substrate doped layer 102 away from the semiconductor substrate 101, and the first doped semiconductor layer 104 is formed on the side of the first passivation layer 103 away from the semiconductor substrate 101, thereby improving the passivation contact effect, reducing the carrier recombination in the second region B, and thus ensuring the open-circuit voltage and the photovoltaic conversion efficiency of the HJT solar cell. The first passivation layer 103 and the first doped semiconductor layer 104 are formed on the surface of the second substrate doped layer 102 only in the second region B, and no semiconductor layer is formed on the surface of the first substrate doped layer 107 in the first region A. Thus, the area of the semiconductor layer on the front side of the solar cell is significantly reduced. On the one hand, the area of the semiconductor layer, which is disposed on the front side of the HJT solar cell and prone to be damaged by UV radiation, is greatly reduced, thereby reducing the damages to the front side of the cell caused by UV radiation, and alleviating the photovoltaic conversion efficiency degradation of the HJT solar cell. On the other hand, the area of the semiconductor layer, which is disposed on the front side of the HJT solar cell and causes a great loss of light absorption, is significantly reduced, thereby reducing the loss of light absorption on the front side of the HJT solar cell, and enhancing the short-circuit current and photovoltaic conversion efficiency of the HJT solar cell. Additionally, the front side of the HJT solar cell needs no transparent electrically conducting layer, thereby reducing the preparation cost of the HJT solar cell. Furthermore, the connected first and second substrate doped layers 107, 102 have relatively good lateral carrier transport capability. Thus, the first electrode 106 can be formed only in the metal contact region, and no first electrode 106 needs be formed in the non-metal contact region, thereby reducing the costs for forming the first electrode 106.

Figure 6:
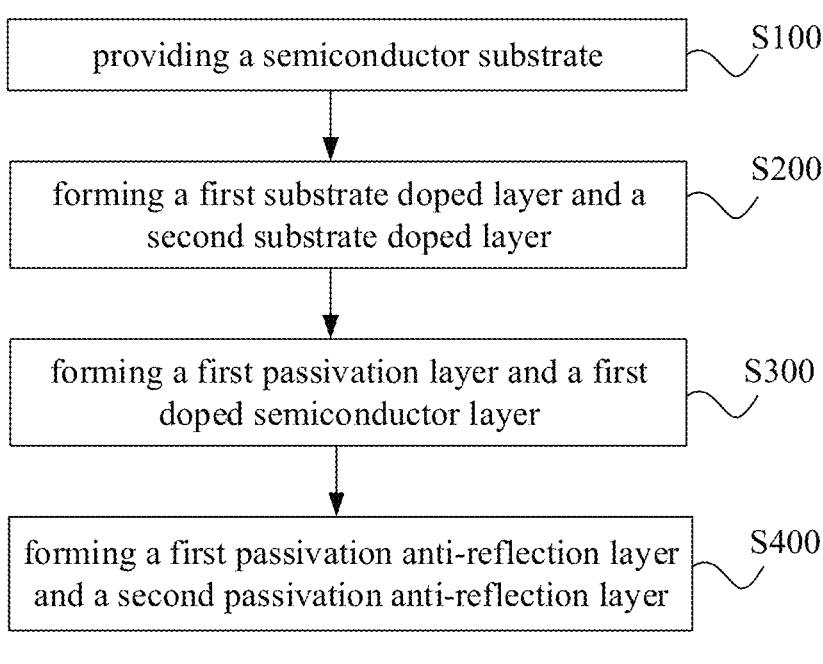
FIG. 6 is a flowchart of a method for preparing a solar cell according to some other embodiments of the present application.

Furthermore, referring to FIG. 6, the method can further include S400.

In S400, a first passivation anti-reflection layer and a second passivation anti-reflection layer are formed.

The first passivation anti-reflection layer 108 can be formed on the side of the first substrate doped layer 107 away from the semiconductor substrate 101, and the second passivation anti-reflection layer 105 can be formed on part of the surface of the first doped semiconductor layer 104 away from the semiconductor substrate 101. That is, there is no semiconductor layer in the non-metal contact region, and the first passivation anti-reflection layer 108 is directly formed on the surface of the first substrate doped layer 107, thereby reducing the light reflection on the front side of the HJT solar cell, increasing the photocurrent, and improving the photoelectric conversion efficiency of the HJT solar cell. Moreover, the first passivation anti-reflection layer 108 also provides protection and passivation for the solar cell. Similarly, by forming the second passivation anti-reflection layer 105 on the surface of the first doped semiconductor layer 104, the light reflection on the front side of the HJT solar cell can be reduced, thereby increasing the photocurrent and enhancing the photoelectric conversion efficiency of the HJT solar cell. In addition, the second passivation anti-reflection layer 105 also provides protection and passivation for the solar cell.

The first passivation anti-reflection layer 108 and the second passivation anti-reflection layer 105 can be formed separately on the side of the first substrate doped layer 107 and the first doped semiconductor layer 104 away from the semiconductor substrate 101. Alternatively, an integrated passivation anti-reflection layer can be formed on the front side of the solar cell obtained in S300, with its portion formed on the surface of the first substrate doped layer 107 defined as the first passivation anti-reflection layer 108 and its portion formed on the surface of the first doped semiconductor layer 104 defined as the second passivation anti-reflection layer 105. Thus, the first passivation anti-reflection layer 108 and the second passivation anti-reflection layer 105 can be formed simultaneously.

Specifically, the passivation anti-reflection layer can be integrally formed on the front side of the solar cell obtained in S300 using the method such as atomic layer deposition (ALD) or PECVD. Then, a portion of the passivation anti-reflection layer on the surface of the first doped semiconductor layer 104 can be selectively removed by using laser etching, allowing the subsequent formation of the first electrode 106 in the location where the portion of the passivation anti-reflection layer is removed. Under the high-temperature generated by laser, the passivation anti-reflection layer can be melted and then removed. The portion of the passivation anti-reflection layer that is formed on the surface of the first substrate doped layer 107 is the first passivation anti-reflection layer 108, and the portion of the passivation anti-reflection layer that is formed on the surface of the first doped semiconductor layer 104 is the second passivation anti-reflection layer 105.

As some specific examples, the thickness of the first passivation anti-reflection layer 108 can be in a range from 50 nm to 150 nm; and/or the first passivation anti-reflection layer 108 can be made of aluminum oxide, silicon oxide, silicon nitride, silicon oxynitride, silicon carbide, magnesium fluoride, indium tin oxide, aluminum-doped zinc oxide, hydrogenated indium oxide, indium tungsten oxide, or any combination thereof. As some specific examples, the thickness of the second passivation anti-reflection layer 105 can be in a range from 50 nm to 150 nm; and/or the second passivation anti-reflection layer 105 can be made of aluminum oxide, silicon oxide, silicon nitride, silicon oxynitride, silicon carbide, magnesium fluoride, indium tin oxide, aluminum-doped zinc oxide, hydrogenated indium oxide, indium tungsten oxide, or any combination thereof.

When the first passivation anti-reflection layer 108 and the second passivation anti-reflection layer 105 are formed simultaneously, they can have the same thickness and be made of the same material.

Figure 7:
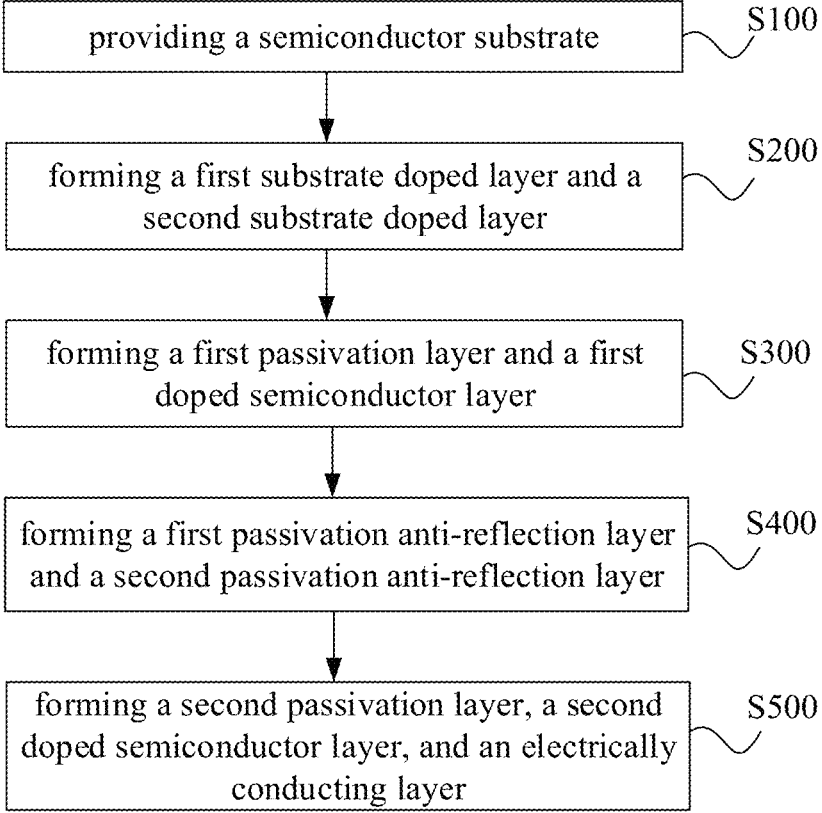
FIG. 7 is a flowchart of a method for preparing a solar cell according to some other embodiments of the present application.

Further, referring to FIG. 7, the method can further include S500.

In S500, a second passivation layer, a second doped semiconductor layer, and an electrically conducting layer are formed.

The second passivation layer 109 is formed on the second surface 101-2 of the semiconductor substrate 101, and the second surface 101-2 is opposite to the first surface 101-1. The second doped semiconductor layer 110 is formed on the side of the second passivation layer 109 away from the semiconductor substrate 101. The electrically conducting layer 111 is formed on the side of the second doped semiconductor layer 110 away from the semiconductor substrate 101. The second passivation layer 109 can passivate the surface of the silicon substrate. The doping type of the second doped semiconductor layer 110 is the same as that of the semiconductor substrate 101, and a back surface field is formed between the second doped semiconductor layer 110 and the semiconductor substrate 101. The electrically conducting layer 111 enhances the electrical conductivity between the second doped semiconductor layer 110 and the second electrode 112.

Specifically, the second passivation layer 109, e.g., the second intrinsic amorphous silicon layer, can be deposited on the second surface 101-2 by using the CVD method. Then, the second doped semiconductor layer 110, e.g., the second doped amorphous silicon layer, can be deposited on the second passivation layer 109 by the CVD method. Finally, the electrically conducting layer 111 can be deposited on the second doped semiconductor layer 110 by using a physical vapor deposition (PVD) method.

In some embodiments, the thickness of the second passivation layer 109 can be in a range from 1 nm to 15 nm. In some embodiments, the thickness of the second doped semiconductor layer 110 can be in a range from 1 nm to 50 nm, and optionally in a range from 5 nm to 15 nm. In some embodiments, the electrically conducting layer 111 can be made of indium tin oxide, aluminum-doped zinc oxide, hydrogenated indium oxide, indium tungsten oxide, or any combination thereof.

In some specific embodiments of the present application, the doping type of the semiconductor substrate 101 is opposite to the doping type of the substrate doped layers formed as above, and the doping type of the substrate doped layers formed as above is the same as the doping type of the first doped semiconductor layer 104. Additionally, the doping type of the second doped semiconductor layer 110 is the same as the doping type of the semiconductor substrate 101. Accordingly, p-n junctions are formed between the semiconductor substrate 101 and the substrate doped layers. In other words, the p-n junctions are formed on the front side of the solar cell. Specifically, there are two approaches to form the p-n junctions on the front side of the solar cell. In the first approach, the semiconductor substrate 101 n-type doped, i.e., is made of n-type monocrystalline silicon; the first substrate doped layer 107, the second substrate doped layer 102, and the first doped semiconductor layer 104 are all p-type doped; the second doped semiconductor layer 110 is n-type doped. In this case, the p-n junctions are formed between the n-type doped semiconductor substrate 101 and the p-type doped substrate doped layers, while the back surface field is formed between the n-type doped semiconductor substrate 101 and the n-type doped second doped semiconductor layer 110. In the second approach, the semiconductor substrate 101 is p-type doped, i.e., made of p-type monocrystalline silicon; the substrate doped layers and the first doped semiconductor layer 104 are all n-type doped; the second doped semiconductor layer 110 is p-type doped. In this case, the p-n junctions are formed between the p-type doped semiconductor substrate 101 and the n-type doped substrate doped layers, while the back surface field is formed between the p-type doped semiconductor substrate 101 and the p-type doped second doped semiconductor layer 110.

In the embodiments of the present application, when the semiconductor substrate 101 is n-type doped, the p-n junctions can be formed either on the front side or the back side of the solar cell. In some embodiments, the p-n junctions are formed on the front side of the solar cell. In this case, electron holes can be prevented from being transported to the back side of the solar cell, thereby reducing carrier recombination, and lowering the requirements for substrate quality and process control. When the semiconductor substrate 101 is n-type doped and the p-n junctions are formed on the front side of the solar cell, the second doped semiconductor layer 110 is n-type doped, i.e., the n-type doped second doped semiconductor layer 110 is disposed on the back side. Compared with the p-type doped second doped semiconductor layer 110, the n-type doped second doped semiconductor layer 110 can be thinner, thereby reducing the loss of light absorption, enhancing the short-circuit current, and reducing the requirement for the second electrodes 112. Accordingly, the number of the second electrodes 112 can be reduced, thereby reducing the shading of light on the back side, and thus further enhancing the short-circuit current. In addition, as less second electrodes 112 are required, the material for forming the second electrode 112 can be saved, and the manufacturing cost can be reduced.

Figure 8:
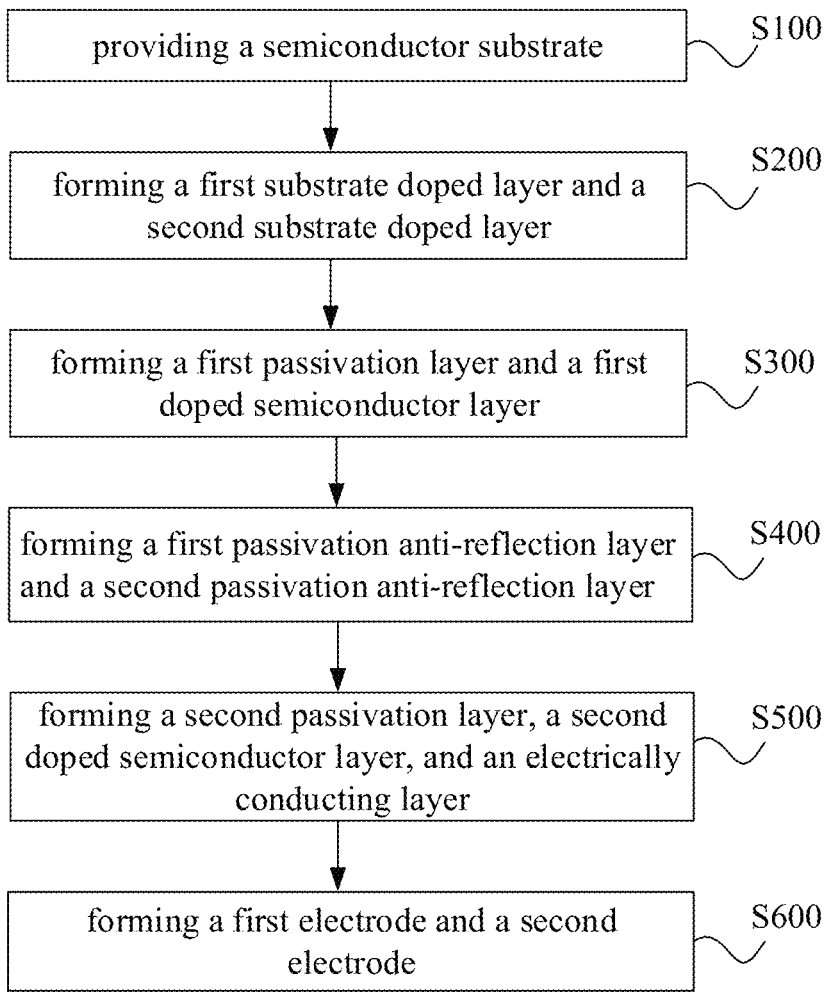
FIG. 8 is a flowchart of a method for preparing a solar cell according to some other embodiments of the present application.

Further, referring to FIG. 8, the method can further include S600.

In S600, a first electrode and a second electrode are formed.

The first electrode 106 is formed on the surface of the first doped semiconductor layer 104, which is away from the semiconductor substrate 101 and is the place on which the second passivation anti-reflection layer 105 is not formed. The second electrode 112 is formed on at least part of the surface of the electrically conducting layer 111 away from the semiconductor substrate 101.

Specifically, an electroplating method can be adopted. Thus, the first electrode 106 can be electroplated onto the surface of the first doped semiconductor layer 104, which is away from the semiconductor substrate 101 and is the place on which the second passivation anti-reflection layer 105 is not formed. The second electrode 112 can be electroplated onto at least part of the surface of the electrically conducting layer 111 away from the semiconductor substrate 101. The electroplating method can include, but not limited to, electro-deposition, photo-induced deposition, or chemical deposition.

Alternatively, a screen-printing method can be adopted. Thus, silver paste can be screen-printed onto the surface of the first doped semiconductor layer 104, which is away from the semiconductor substrate 101 and is the place on which the second passivation anti-reflection layer 105 is not formed, thereby forming the first electrode 106, and silver paste can be screen-printed onto at least part of the surface of the electrically conducting layer 111 away from the semiconductor substrate 101, thereby forming the second electrode 112.

As some specific examples, the material of the first electrode 106 can include silver, copper, gold, aluminum, tin, titanium, a silver compound, a copper compound, a gold compound, an aluminum compound, a tin compound, a titanium compound, or any combination thereof. As some specific examples, the material of the second electrode 112 can include silver, copper, gold, aluminum, tin, titanium, a silver compound, a copper compound, a gold compound, an aluminum compound, a tin compound, a titanium compound, or any combination thereof.

It should be noted that the method for preparing the solar cell is not intended to be limited to a specific preparation sequence from S100 to S600. Other reasonable sequences can be adopted in the method of the present application.

In a third aspect of the present application, a photovoltaic module is provided. An embodiment of the photovoltaic module includes one or more solar cells described in the above embodiments. As such, the solar cell(s) in the photovoltaic module can achieve alleviated photovoltaic conversion efficiency degradation and enhanced short-circuit current and photovoltaic conversion efficiency.

The photovoltaic module with the function of power output can be a module product produced by laminating, encapsulating, and other processes. Multiple solar cells can be connected in series and/or parallel in the photovoltaic module. Specifically, the photovoltaic module can sequentially include, from the front side to the back side, a photovoltaic glass sheet, an encapsulation film, multiple solar cells, another encapsulation film, a back plate, etc.

The subsequent detailed description of examples of the present application is provided only for explanatory purposes and should not be interpreted as limiting the scope of the present application. Furthermore, unless stated otherwise, all reagents utilized in the following examples are commercially available or can be synthesized using methods known in the art. Additionally, the reaction conditions that are not explicitly stated can be easily obtained by those skilled in the art.

Example 1

In the present example, a solar cell is prepared using the following method.

Step 1: A pristine n-type monocrystalline silicon substrate with a thickness of 130 μm is provided. The pristine n-type monocrystalline silicon substrate is etched with an alkaline etching solution to remove contaminants thereon and to texture its surfaces for anti-reflection. The alkaline etching solution is a 6% (w/w) KOH solution. The alkaline-etched n-type monocrystalline silicon substrate has a first surface, corresponding to the light-receiving side of the solar cell, and a second surface, corresponding to the side of the solar cell away from light. The first surface includes first and second regions adjacent to each other. The ratio of the dimension of an individual first region along the first direction to the dimension of an individual second region along the first direction is 50:1. Step 2: The textured n-type monocrystalline silicon substrate is placed in a tubular furnace, allowing boron to diffuse into the silicon substrate, thereby forming a p-type substrate doped layer with a thickness of 0.7 μm and a sheet resistance of 200 Ohm/sq. Step 3: A tunnel $SiO_2$ layer with a thickness of 1.5 nm is formed on the side of the p-type substrate doped layer away from the n-type monocrystalline silicon substrate by using thermal oxidation; then a boron-doped microcrystalline silicon layer with a thickness of 300 nm and a boron doping concentration of $7 \times 10^{19}$ $cm^{-3}$ is formed on the tunnel $SiO_2$ layer by using PECVD; and finally the boron-doped microcrystalline silicon layer is annealed at 920 degrees Celsius for 10 minutes, thereby being converted into a boron-doped polysilicon layer. Step 4: The tunnel $SiO_2$ layer and the boron-doped polysilicon layer corresponding to the first regions are removed using laser ablation and alkaline etching, leaving only the tunnel $SiO_2$ layer and the boron-doped polysilicon layer corresponding to the second regions. Step 5: By using ALD and PECVD, a stack of an aluminum oxide layer and a silicon nitride layer as an integrated passivation anti-reflection layer with a total thickness of 80 nm is formed on the front side of the solar cell obtained in step 4. Step 6: the layers that wrap around the second surface are removed using a single-side cleaning machine; the second surface of the silicon substrate is cleaned sequentially with a concentrated sulfuric acid solution, a hydrogen peroxide/ammonia mixed solution, and a hydrogen peroxide/hydrochloric acid mixed solution; an intrinsic amorphous silicon layer with a thickness of 8 nm is then deposited on the second surface, and a phosphorus-doped amorphous silicon layer with a thickness of 15 nm and a doping concentration of $1 \times 10^{20}$ $cm^{-3}$ is then deposited on the surface of the intrinsic amorphous silicon layer, both using CVD; then an ITO layer with a thickness of 80 nm is deposited on the phosphorus-doped amorphous silicon layer using PVD. Step 7: Portions of the passivation anti-reflection layer on the boron-doped polysilicon layer in the second regions are scanned with laser. Under the high-temperature generated by laser, the scanned portions of the passivation anti-reflection layer can be melted and then removed for the subsequent formation of the first electrodes in the location where the portions of the passivation anti-reflection layer are removed. Step 8: First electrodes are electroplated onto the surface of the boron-doped polysilicon layer away from the silicon substrate where the passivation anti-reflection layer is not formed, and second electrodes are electroplated onto portions of the surface of the ITO layer away from the silicon substrate, both using the electroplating method. Step 9-Light injection and IV testing: The solar cell with the electroplated electrodes is subjected to light-induced activation; then the short-circuit current and photovoltaic conversion efficiency of the finished solar cell are tested.

Example 2

The present example provides a solar cell. The present example differs from Example 1 in that: the thickness of the p-type substrate doped layer is 0.5 μm, and the sheet resistance of the p-type substrate doped layer is 300 Ohm/sq; the thickness of the tunnel $SiO_2$ layer is 1 nm; the thickness of the boron-doped polysilicon silicon layer is 150 nm; the thickness of the passivation anti-reflection layer is 100 nm. Except the above, the present example is the same as Example 1.

Example 3

The present example provides a solar cell. The present example differs from Example 1 in that: the thickness of the p-type substrate doped layer is 1 μm, and the sheet resistance of the p-type substrate doped layer is 150 Ohm/sq; the thickness of the tunnel $SiO_2$ layer is 2 nm; the thickness of the boron-doped polysilicon silicon layer is 350 nm; the thickness of the passivation anti-reflection layer is 120 nm. Except the above, the present example is the same as Example 1.

Example 4

The present example provides a solar cell. The present example differs from Example 1 in that: the thickness of the p-type substrate doped layer is 2 μm, and the sheet resistance of the p-type substrate doped layer is 100 Ohm/sq; the thickness of the tunnel $SiO_2$ layer is 2.5 nm; the thickness of the boron-doped polysilicon silicon layer is 400 nm; the thickness of the passivation anti-reflection layer is 130 nm. Except the above, the present example is the same as Example 1.

Example 5

In the present example, a solar cell is prepared using the following method. Step 1: A pristine p-type monocrystalline silicon substrate with a thickness of 130 μm is provided. The pristine p-type monocrystalline silicon substrate is etched with an alkaline etching solution to remove contaminants thereon and to texture its surfaces for anti-reflection. The alkaline etching solution is a 6% (w/w) KOH solution. The alkaline-etched p-type monocrystalline silicon substrate has a first surface, corresponding to the light-receiving side of the solar cell, and a second surface, corresponding to the side of the solar cell away from light. The first surface includes first and second regions adjacent to each other. The ratio of the dimension of an individual first region along the first direction to the dimension of an individual second region along the first direction is 50:1. Step 2: The textured p-type monocrystalline silicon substrate is placed in a tubular furnace, allowing phosphorus to diffuse into the silicon substrate, thereby forming a p-type substrate doped layer with a thickness of 0.3 μm and a sheet resistance of 300 Ohm/sq. Step 3: A tunnel $SiO_2$ layer with a thickness of 1.5 nm is formed on the side of the p-type substrate doped layer away from the p-type monocrystalline silicon substrate by using thermal oxidation; then a phosphorus-doped microcrystalline silicon layer with a thickness of 150 nm and a phosphorus doping concentration of $1 \times 10^{20}$ $cm^{-3}$ is formed on the tunnel $SiO_2$ layer by using PECVD; and finally the phosphorus-doped microcrystalline silicon layer is annealed at 920 degrees Celsius for 10 minutes, thereby being converted into a phosphorus-doped polysilicon layer. Step 4: The tunnel oxide layer and the phosphorus-doped polysilicon layer corresponding to the first regions are removed using laser ablation, leaving only the tunnel oxide layer and the phosphorus-doped polysilicon layer corresponding to the second regions. Step 5: By using ALD and PECVD, a stack of an aluminum oxide layer and a silicon nitride layer as an integrated passivation anti-reflection layer with a total thickness of 80 nm is formed on the front side of the solar cell obtained in step 4. Step 6: the layers that wrap around the second surface are removed using a single-side cleaning machine; the second surface of the silicon substrate is cleaned sequentially with a concentrated sulfuric acid solution, a hydrogen peroxide/ammonia mixed solution, and a hydrogen peroxide/hydrochloric acid mixed solution; an intrinsic amorphous silicon layer with a thickness of 8 nm is then deposited on the second surface, and a boron-doped amorphous silicon layer with a thickness of 25 nm and a doping concentration of $1 \times 10^{20}$ $cm^{-3}$ is then deposited on the surface of the intrinsic amorphous silicon layer, both using CVD; then an ITO layer with a thickness of 80 nm is deposited on the boron-doped amorphous silicon layer using PVD. Step 7: Portions of the passivation anti-reflection layer on the phosphorus-doped polysilicon layer in the second regions are scanned with laser. Under the high-temperature generated by laser, the scanned portions of the passivation anti-reflection layer can be melted and then removed for the subsequent formation of the first electrodes in the location where the portions of the passivation anti-reflection layer are removed. Step 8: First electrodes are electroplated onto the surface of the phosphorus-doped polysilicon layer away from the silicon substrate where the passivation anti-reflection layer is not formed, and second electrodes are electroplated onto portions of the surface of the ITO layer away from the silicon substrate, both using the electroplating method. Step 9-Light injection and IV testing: The solar cell with the electroplated electrodes is subjected to light-induced activation; then the short-circuit current and photovoltaic conversion efficiency of the finished solar cell are tested.

Example 6

The present example provides a solar cell. The present example differs from Example 5 in that: the thickness of the n-type substrate doped layer is 0.5 μm, and the sheet resistance of the n-type substrate doped layer is 200 Ohm/sq; the thickness of the tunnel $SiO_2$ layer is 1 nm; the thickness of the phosphorus-doped polysilicon silicon layer is 100 nm;

the thickness of the passivation anti-reflection layer is 100 nm. Except the above, the present example is the same as Example 5.

Example 7

The present example provides a solar cell. The present example differs from Example 5 in that: the thickness of the n-type substrate doped layer is 1 μm, and the sheet resistance of the n-type substrate doped layer is 100 Ohm/sq; the thickness of the tunnel $SiO_2$ layer is 2 nm; the thickness of the phosphorus-doped polysilicon silicon layer is 200 nm; the thickness of the passivation anti-reflection layer is 120 nm. Except the above, the present example is the same as Example 5.

Example 8

The present example provides a solar cell. The present example differs from Example 5 in that: the thickness of the n-type substrate doped layer is 2 μm, and the sheet resistance of the n-type substrate doped layer is 80 Ohm/sq; the thickness of the tunnel $SiO_2$ layer is 3 nm; the thickness of the phosphorus-doped polysilicon silicon layer is 400 nm; the thickness of the passivation anti-reflection layer is 130 nm. Except the above, the present example is the same as Example 5.

Example 9

In the present example, a solar cell is prepared using the following method. Step 1: A pristine n-type monocrystalline silicon substrate with a thickness of 130 μm is provided. The pristine n-type monocrystalline silicon substrate is etched with an alkaline etching solution to remove contaminants thereon and to texture its surfaces for anti-reflection. The alkaline etching solution is a 6% (w/w) KOH solution. The alkaline-etched n-type monocrystalline silicon substrate has a first surface, corresponding to the light-receiving side of the solar cell, and a second surface, corresponding to the side of the solar cell away from light. The first surface includes first and second regions adjacent to each other. The ratio of the dimension of an individual first region along the first direction to the dimension of an individual second region along the first direction is 50:1. Step 2: The textured n-type monocrystalline silicon substrate is placed in a tubular furnace, allowing boron to diffuse into the silicon substrate, thereby forming a p-type substrate doped layer with a thickness of 0.7 μm and a sheet resistance of 200 Ohm/sq. Step 3: A first intrinsic amorphous silicon layer with a thickness of 1.5 nm is formed on the side of the p-type substrate doped layer away from the n-type monocrystalline silicon substrate by using CVD; then a boron-doped amorphous silicon layer with a thickness of 300 nm and a boron doping concentration of $1\times10^{20}$ $cm^{-3}$ is deposited on the first intrinsic amorphous silicon layer. Step 4: The first intrinsic amorphous silicon layer and the boron-doped amorphous silicon layer corresponding to the first regions are removed using laser ablation, leaving only the first intrinsic amorphous silicon layer and the boron-doped amorphous silicon layer corresponding to the second regions. Step 5: By using ALD and PECVD, a transparent conductive oxide (TCO) film with a total thickness of 80 nm is formed on the front side of the solar cell obtained in step 4. Step 6: the layers that wrap around the second surface are removed using a single-side cleaning machine; the second surface of the silicon substrate is cleaned sequentially with a concentrated sulfuric acid solution, a hydrogen peroxide/ammonia mixed solution, and a hydrogen peroxide/hydrochloric acid mixed solution; a second intrinsic amorphous silicon layer with a thickness of 8 nm is then deposited on the second surface, and a phosphorus-doped amorphous silicon layer with a thickness of 15 nm and a doping concentration of $1\times10^{20}$ $cm^{-3}$ is then deposited on the surface of the second intrinsic amorphous silicon layer, both using CVD; then an ITO layer with a thickness of 80 nm is deposited on the phosphorus-doped amorphous silicon layer using PVD. Step 7: A low-temperature silver paste is screen-printed onto part of the surface of the TCO film away from the silicon substrate to form first silver electrodes, and screen-printed onto part of the surface of the ITO layer away from the silicon substrate to form second silver electrodes. Step 8-Light injection and IV testing: The solar cell is subjected to light-induced activation; then the short-circuit current and photovoltaic conversion efficiency of the finished solar cell are tested.

Example 10

The present example provides a solar cell. The present example differs from Example 9 in that: the thickness of the p-type substrate doped layer is 0.5 μm, and the sheet resistance of the p-type substrate doped layer is 300 Ohm/sq; the thickness of the first intrinsic amorphous silicon layer is 1 nm; the thickness of the boron-doped amorphous silicon layer is 150 nm; the thickness of the TCO film is 100 nm. Except the above, the present example is the same as Example 9.

Example 11

The present example provides a solar cell. The present example differs from Example 9 in that: the thickness of the p-type substrate doped layer is 1 μm, and the sheet resistance of the p-type substrate doped layer is 150 Ohm/sq; the thickness of the first intrinsic amorphous silicon layer is 2 nm; the thickness of the boron-doped amorphous silicon layer is 350 nm; the thickness of the TCO film is 120 nm. Except the above, the present example is the same as Example 9.

Example 12

The present example provides a solar cell. The present example differs from Example 9 in that: the thickness of the p-type substrate doped layer is 2 μm, and the sheet resistance of the p-type substrate doped layer is 100 Ohm/sq; the thickness of the first intrinsic amorphous silicon layer is 2.5 nm; the thickness of the boron-doped amorphous silicon layer is 400 nm; the thickness of the TCO film is 130 nm. Except the above, the present example is the same as Example 9.

Example 13

In the present example, a solar cell is prepared using the following method. Step 1: A pristine p-type monocrystalline silicon substrate with a thickness of 130 μm is provided. The pristine p-type monocrystalline silicon substrate is etched with an alkaline etching solution to remove contaminants thereon and to texture its surfaces for anti-reflection. The alkaline etching solution is a 6% (w/w) KOH solution. The alkaline-etched p-type monocrystalline silicon substrate has a first surface, corresponding to the light-receiving side of the solar cell, and a second surface, corresponding to the side of the solar cell away from light. The first surface includes first and second regions adjacent to each other. The ratio of the dimension of an individual first region along the first direction to the dimension of an individual second region along the first direction is 50:1. Step 2: The textured p-type monocrystalline silicon substrate is placed in a tubular furnace, allowing phosphorus to diffuse into the silicon substrate, thereby forming a p-type substrate doped layer with a thickness of 0.3 μm and a sheet resistance of 300 Ohm/sq. Step 3: A first intrinsic amorphous silicon layer with a thickness of 1.5 nm is formed on the side of the p-type substrate doped layer away from the p-type monocrystalline silicon substrate by using CVD; then a phosphorus-doped amorphous silicon layer with a thickness of 150 nm and a boron doping concentration of $1\times10^{20}$ cm$^{-3}$ is deposited on the first intrinsic amorphous silicon layer. Step 4: The first intrinsic amorphous silicon layer and the phosphorus-doped amorphous silicon layer corresponding to the first regions are removed using laser ablation, leaving only the first intrinsic amorphous silicon layer and the phosphorus-doped amorphous silicon layer corresponding to the second regions. Step 5: By using ALD and PECVD, a transparent conductive oxide (TCO) film with a total thickness of 80 nm is formed on the front side of the solar cell obtained in step 4. Step 6: the layers that wrap around the second surface are removed using a single-side cleaning machine; the second surface of the silicon substrate is cleaned sequentially with a concentrated sulfuric acid solution, a hydrogen peroxide/ammonia mixed solution, and a hydrogen peroxide/hydrochloric acid mixed solution; a second intrinsic amorphous silicon layer with a thickness of 8 nm is then deposited on the second surface, and a boron-doped amorphous silicon layer with a thickness of 25 nm and a doping concentration of $1\times10^{20}$ cm$^{-3}$ is then deposited on the surface of the second intrinsic amorphous silicon layer, both using CVD; then an ITO layer with a thickness of 80 nm is deposited on the boron-doped amorphous silicon layer using PVD. Step 7: A low-temperature silver paste is screen-printed onto part of the surface of the TCO film away from the silicon substrate to form first silver electrodes, and screen-printed onto part of the surface of the ITO layer away from the silicon substrate to form second silver electrodes. Step 8-Light injection and IV testing: The solar cell is subjected to light-induced activation; then the short-circuit current and photovoltaic conversion efficiency of the finished solar cell are tested.

Example 14

The present example provides a solar cell. The present example differs from Example 13 in that: the thickness of the n-type substrate doped layer is 0.5 μm, and the sheet resistance of the n-type substrate doped layer is 200 Ohm/sq; the thickness of the first intrinsic amorphous silicon layer is 1 nm; the thickness of the phosphorus-doped amorphous silicon layer is 100 nm; the thickness of the TCO film is 100 nm. Except the above, the present example is the same as Example 13.

Example 15

The present example provides a solar cell. The present example differs from Example 13 in that: the thickness of the n-type substrate doped layer is 1 μm, and the sheet resistance of the n-type substrate doped layer is 100 Ohm/sq; the thickness of the first intrinsic amorphous silicon layer is 2 nm; the thickness of the phosphorus-doped amorphous silicon layer is 200 nm; the thickness of the TCO film is 120 nm. Except the above, the present example is the same as Example 13.

Example 16

The present example provides a solar cell. The present example differs from Example 13 in that: the thickness of the n-type substrate doped layer is 2 μm, and the sheet resistance of the n-type substrate doped layer is 80 Ohm/sq; the thickness of the first intrinsic amorphous silicon layer is 3 nm; the thickness of the phosphorus-doped amorphous silicon layer is 400 nm; the thickness of the TCO film is 130 nm. Except the above, the present example is the same as Example 13.

Comparative Example 1

In the present comparative example, a solar cell is prepared using the following method. Step 1: A pristine n-type monocrystalline silicon substrate with a thickness of 130 μm is provided. The pristine n-type monocrystalline silicon substrate is etched with an alkaline etching solution to remove contaminants thereon and to texture its surfaces for anti-reflection. The alkaline etching solution is a 6% (w/w) KOH solution. The alkaline-etched n-type monocrystalline silicon substrate has a first surface, corresponding to the light-receiving side of the solar cell, and a second surface, corresponding to the side of the solar cell away from light. Step 2: A first intrinsic amorphous silicon layer with a thickness of 1.5 nm is deposited on the first surface of the textured silicon substrate, and a second intrinsic amorphous silicon layer with a thickness of 8 nm is deposited on the second surface of the textured silicon substrate, both using PECVD plasma deposition equipment. Step 3: A boron-doped amorphous silicon layer with a thickness of about 300 nm and a doping concentration of $1\times10^{20}$ cm$^{-3}$ is deposited on the surface of the first intrinsic amorphous silicon layer, and a phosphorus-doped amorphous silicon layer with a thickness of about 15 nm and a doping concentration of $1\times10^{20}$ cm$^{-3}$ is deposited on the surface of the second intrinsic amorphous silicon layer, both using PECVD plasma deposition equipment. Step 4: A first ITO layer with a thickness of about 80 nm is deposited on the entire the boron-doped amorphous silicon layer, and a second ITO layer with a thickness of about 80 nm is deposited on the entire the phosphorus-doped amorphous silicon layer, both using PVD magnetron sputtering equipment. Step 5: A low-temperature silver paste is screen-printed onto part of a surface of the first ITO layer to form first silver electrodes, and screen-printed onto part of a surface of the second ITO layer to form second silver electrodes. Step 6-Light injection and IV testing: The solar cell is subjected to light-induced activation; then the short-circuit current and photovoltaic conversion efficiency of the finished solar cell are tested.

Comparative Example 2

In the present comparative example, a solar cell is prepared using the following method. Step 1: A pristine p-type monocrystalline silicon substrate with a thickness of 130 μm is provided. The pristine p-type monocrystalline silicon substrate is etched with an alkaline etching solution to remove contaminants thereon and to texture its surfaces for anti-reflection. The alkaline etching solution is a 6% (w/w) KOH solution. The alkaline-etched p-type monocrystalline silicon substrate has a first surface, corresponding to the light-receiving side of the solar cell, and a second surface, corresponding to the side of the solar cell away from light. Step 2: A first intrinsic amorphous silicon layer with a thickness of 1.5 nm is deposited on the first surface of the textured silicon substrate, and a second intrinsic amorphous silicon layer with a thickness of 8 nm is deposited on the second surface of the textured silicon substrate, both using PECVD plasma deposition equipment. Step 3: A phosphorus-doped amorphous silicon layer with a thickness of about 150 nm and a doping concentration of $1\times10^{20}$ cm$^{-3}$ is deposited on the surface of the first intrinsic amorphous silicon layer, and a boron-doped amorphous silicon layer with a thickness of about 25 nm and a doping concentration of $1\times10^{20}$ cm$^{-3}$ is deposited on the surface of the second intrinsic amorphous silicon layer, both using PECVD plasma deposition equipment. Step 4: A first ITO layer with a thickness of about 80 nm is deposited on the entire the phosphorus-doped amorphous silicon layer, and a second ITO layer with a thickness of about 80 nm is deposited on the entire the boron-doped amorphous silicon layer, both using PVD magnetron sputtering equipment. Step 5: A low-temperature silver paste is screen-printed onto part of a surface of the first ITO layer to form first silver electrodes, and screen-printed onto part of a surface of the second ITO layer to form second silver electrodes. Step 6-Light injection and IV testing: The solar cell is subjected to light-induced activation; then the short-circuit current and photovoltaic conversion efficiency of the finished solar cell are tested.

The short-circuit current (Isc) and photovoltaic conversion efficiency of each solar cell prepared in Examples 1 to 16 and Comparative Examples 1 to 2 are tested. The test results indicate that, compared with traditional HJT solar cells under the same conditions, the short-circuit current Isc of each of the solar cells in the examples of the present application is significantly increased, and the degradation of photovoltaic conversion efficiency is notably alleviated. Furthermore, compared with the examples having the combination of the intrinsic amorphous silicon layer and the doped amorphous silicon layer on the front side, the examples having the combination of the tunnel SiO$_2$ layer and the doped polysilicon layer on the front side achieve further increased short-circuit currents Isc and further reduced efficiency degradation.

The terms "an embodiment", "some embodiments", "specific embodiments", "an example", and "some examples" in the present description refer to that specific features, structures, or characteristics described with reference to the embodiment(s) or example(s) can be included in at least one embodiment or example of the present application. The terms mentioned in various places in the description do not necessarily refer to the same embodiment or example, nor are they independent or alternative embodiments mutually exclusive with other embodiments or examples. The specific features, structures, or characteristics described can be combined in an appropriate manner in any one or more embodiments or examples. Additionally, without conflicting with each other, those skilled in the art can combine and integrate different embodiments or examples and the features of different embodiments or examples as described in the present specification. Although embodiments of the present application have been shown and described above, it should be understood that the above embodiments are exemplary and should not be construed as limiting the present application. Those skilled in the art can make changes, modifications, substitutions, and variations to the above embodiments within the scope of the present application.

What is claimed is:

1. A solar cell, comprising:
   a semiconductor substrate, the semiconductor substrate comprising a first surface, the first surface comprising a first region and a second region adjacent to the first region along a first direction;
   a first substrate doped layer, the first substrate doped layer being located in the first region;
   a second substrate doped layer, the second substrate doped layer being located in the second region, the first substrate doped layer being connected to the second substrate doped layer;
   a first passivation layer, the first passivation layer being located on a side of the second substrate doped layer away from the semiconductor substrate; and
   a first doped semiconductor layer, the first doped semiconductor layer being located on a side of the first passivation layer away from the semiconductor substrate;
   wherein a doping type of the semiconductor substrate is opposite to a doping type of the first substrate doped layer; doping types of the first substrate doped layer, the second substrate doped layer, and the first doped semiconductor layer are the same; the first region is a non-metal contact region, and the second region is a metal contact region; and
   wherein the first passivation layer comprises a first intrinsic amorphous silicon layer, and the first doped semiconductor layer comprises at least one of a first doped amorphous silicon layer, a first doped nanocrystalline silicon layer, or a first doped microcrystalline silicon layer.

2. The solar cell according to claim 1, wherein the semiconductor substrate is an n-type doped substrate, and the first substrate doped layer, the second substrate doped layer, and the first doped semiconductor layer are all p-type doped layers; or
   the semiconductor substrate is a p-type doped substrate, and the first substrate doped layer, the second substrate doped layer, and the first doped semiconductor layer are all n-type doped layers.

3. The solar cell according to claim 1, wherein a thickness of the first substrate doped layer and a thickness of the second substrate doped layer are independently in a range from 0.01 μm to 2 μm.

4. The solar cell according to claim 1, wherein a sheet resistance of the first substrate doped layer and a sheet resistance of the second substrate doped layer are independently in a range from 50 Ohm/sq to 500 Ohm/sq.

5. The solar cell according to claim 1, wherein a thickness of the first passivation layer is in a range from 0.5 nm to 3 nm; and/or
   the first passivation layer is made of silicon oxide, aluminum oxide, or a combination thereof.

6. The solar cell according to claim 1, wherein a thickness of the first doped semiconductor layer is in a range from 10 nm to 500 nm.

7. The solar cell according to claim 1, wherein a ratio of a dimension of an individual first region along the first direction to a dimension of an individual second region along the first direction is in a range from 10:1 to 200:1.

8. The solar cell according to claim 1, wherein the first surface is a textured surface, comprising a pyramid texture and/or an etch-pit texture.

9. The solar cell according to claim 1, further comprising a first passivation anti-reflection layer, wherein the first passivation anti-reflection layer is disposed on a side of the first substrate doped layer away from the semiconductor substrate.

10. The solar cell according to claim 9, further comprising:
a second passivation anti-reflection layer, the second passivation anti-reflection layer being disposed on at least part of a surface of the first doped semiconductor layer away from the semiconductor substrate; and
a first electrode, the first electrode penetrating the second passivation anti-reflection layer and being in direct contact with the first doped semiconductor layer to form an electrical connection, or the first electrode being disposed on at least part of a surface of the second passivation anti-reflection layer away from the semiconductor substrate to form an electrical connection with the first doped semiconductor layer through the second passivation anti-reflection layer.

11. The solar cell according to claim 9, wherein a thickness of the first passivation anti-reflection layer is in a range from 50 nm to 150 nm; and/or
the first passivation anti-reflection layer is made of aluminum oxide, silicon oxide, silicon nitride, silicon oxynitride, silicon carbide, magnesium fluoride, indium tin oxide, aluminum-doped zinc oxide, hydrogenated indium oxide, indium tungsten oxide, or any combination thereof.

12. The solar cell according to claim 10, wherein a thickness of the second passivation anti-reflection layer is in a range from 50 nm to 150 nm; and/or
the second passivation anti-reflection layer is made of aluminum oxide, silicon oxide, silicon nitride, silicon oxynitride, silicon carbide, magnesium fluoride, indium tin oxide, aluminum-doped zinc oxide, hydrogenated indium oxide, indium tungsten oxide, or any combination thereof.

13. The solar cell according to claim 10, wherein the first electrode is made of silver, copper, gold, aluminum, tin, titanium, a silver compound, a copper compound, a gold compound, an aluminum compound, a tin compound, a titanium compound, or any combination thereof.

14. The solar cell according to claim 1, further comprising:
a second passivation layer, the second passivation layer being disposed on a second surface of the semiconductor substrate, the second surface being opposite to the first surface;
a second doped semiconductor layer, the second doped semiconductor layer being disposed on a side of the second passivation layer away from the semiconductor substrate;
an electrically conducting layer, the electrically conducting layer being disposed on a side of the second doped semiconductor layer away from the semiconductor substrate; and
a second electrode, the second electrode forming an electrical connection with the electrically conducting layer.

15. The solar cell according to claim 14, wherein doping types of the second doped semiconductor layer and the semiconductor substrate are the same.

16. The solar cell according to claim 15, wherein the second doped semiconductor layer comprises at least one of a second doped amorphous silicon layer, a second doped nanocrystalline silicon layer, or a second doped microcrystalline silicon layer; and
the second passivation layer comprises a second intrinsic amorphous silicon layer.

17. The solar cell according to claim 14, wherein a thickness of the second passivation layer is in a range from 1 nm to 15 nm; and/or
a thickness of the second doped semiconductor layer is in a range from 1 nm to 50 nm; and/or
a thickness of the electrically conducting layer is in a range from 20 nm to 200 nm; and/or
the electrically conducting layer is made of indium tin oxide, aluminum-doped zinc oxide, hydrogenated indium oxide, indium tungsten oxide, or any combination thereof.

18. The solar cell according to claim 14, wherein the second electrode is made of silver, copper, gold, aluminum, tin, titanium, a silver compound, a copper compound, a gold compound, an aluminum compound, a tin compound, a titanium compound, or any combination thereof.

19. A photovoltaic module, comprising the solar cell according to claim 1.

20. A solar cell, comprising:
a semiconductor substrate, the semiconductor substrate comprising a first surface, the first surface comprising a first region and a second region adjacent to the first region along a first direction;
a first substrate doped layer, the first substrate doped layer being located in the first region;
a second substrate doped layer, the second substrate doped layer being located in the second region, the first substrate doped layer being connected to the second substrate doped layer;
a first passivation layer, the first passivation layer being located on a side of the second substrate doped layer away from the semiconductor substrate; and
a first doped semiconductor layer, the first doped semiconductor layer being located on a side of the first passivation layer away from the semiconductor substrate;
wherein a doping type of the semiconductor substrate is opposite to a doping type of the first substrate doped layer; doping types of the first substrate doped layer, the second substrate doped layer, and the first doped semiconductor layer are the same; the first region is a non-metal contact region, and the second region is a metal contact region;
wherein the first passivation layer comprises a first intrinsic amorphous silicon layer, and the first doped semiconductor layer comprises at least one of a first doped amorphous silicon layer, a first doped nanocrystalline silicon layer, or a first doped microcrystalline silicon layer; and
wherein no semiconductor layer is disposed on the surface of the first substrate doped layer in the first region.

* * * * *